United States Patent [19]
Koyabu

[11] Patent Number: 5,267,206
[45] Date of Patent: Nov. 30, 1993

[54] SEMICONDUCTOR INTEGRATED CIRCUIT WITH FUNCTIONAL TEST MODE TO RANDOM ACCESS MEMORY UNIT

[75] Inventor: Kunihiro Koyabu, Tokyo, Japan
[73] Assignee: NEC Corporation, Tokyo, Japan
[21] Appl. No.: 718,548
[22] Filed: Jun. 20, 1991
[30] Foreign Application Priority Data
  Jun. 28, 1990 [JP] Japan .................................. 2-172302
[51] Int. Cl.⁵ .............................................. G11C 7/00
[52] U.S. Cl. ..................................... 365/201; 371/212
[58] Field of Search ............... 365/201; 371/68.1, 21.1, 371/21.2
[56] References Cited
U.S. PATENT DOCUMENTS
3,805,152  4/1974  Ebersman et al. ................. 371/21.2
5,117,393  5/1992  Miyazawa et al. ................. 365/201

Primary Examiner—Robert J. Pascal
Assistant Examiner—Tan Dinh
Attorney, Agent, or Firm—Laff, Whitesel, Conte & Saret

[57] ABSTRACT

A semiconductor integrated circuit comprises a random access memory subjected to a functional test by a testing unit with a multi-bit testing data, and the multi-bit testing data is distributed to parts of a write-in data port of the random access memory device through a plurality sets of auxiliary write-in data line groups, because the write-in data port can accept a multi-bit write-in data larger in number than the multi-bit testing data, wherein a comparator is coupled to parts of the read-out data port for producing a reporting signal indicative of consistency or inconsistency so that the testing unit examines the random access memory device with the read-out bit at one of the parts of the read-out data port and the reporting signal.

6 Claims, 12 Drawing Sheets

SEMICONDUCTOR INTEGRATED CIRCUIT WITH FUNCTIONAL TEST MODE TO RANDOM ACCESS MEMORY UNIT

FIELD OF THE INVENTION

This invention relates to a semiconductor integrated circuit and, more particularly, to a semiconductor integrated circuit with a functional testing mode to a random access memory unit.

DESCRIPTION OF THE RELATED ART

FIG. 1 shows a typical example of a single port random access memory device (which is abbreviated as "RAM" in the drawings), and the single port random access memory device 1 has a single write-in data port WR, a single read-out data port RD and a controlling signal port CTL. The random access memory device 1 is incorporated in a semiconductor integrated circuit, and the semiconductor integrated circuit further has various units (not shown). The single port random access memory device 1 is communicable with a testing unit, and is subjected to a functional test. When the semiconductor integrated circuit enters the functional testing mode, a write/read controlling signal W/R and a chip enable signal CE are fed from the testing unit through controlling signal lines 10 and 20 to the controlling signal port CTL. If the chip enable signal CE goes to an active level, the random access memory device 1 becomes responsive to address bits fed from address lines 30 to the address port AD, and selectively enters a write-in mode and a read-out mode of operation depending upon the write/read controlling signal W/R. Namely, when the write/read controlling signal W/R is indicative of the write-in mode of operation, the random access memory device 1 writes a multi-bit write-in data on write-in data lines 40 into memory cells designated by the address bits. On the other hand, the random access memory device 1 in the read-out mode of operation supplies a multi-bit read-out data from memory cells designated by the address bits through the single read-out data port RD to read-out data lines 50. The read-out data lines 50 propagate the multi-bit read-out data to the testing unit, and the testing unit examines the multi-bit read-out data to see whether or not any problem takes place in the single port random access memory device 1.

Thus, the random access memory device 1 is subjected to the functional test. It is not desirable for the semiconductor integrated circuit to increase the signal lines 10 to 50 because of complexity of the wiring arrangement. In other words, the single port random access memory device 1 is testable in a single functional testing operation as long as the number of the signal lines 10 to 50 are large enough to communicate with the ports AD, WR, RD and CTL.

However, if the address bits and/or the parallel bits or the width of the multi-bit write-in data fed to a single port random access memory device exceeds a predetermined number inherent in the individual testing unit, a single testing operation can not check such a large single port random access memory device, and, for this reason, the connection between the testing unit and the single port random access memory device is modified as shown in FIG. 2 or FIG. 3.

FIG. 2 shows a prior art random access memory device 2 which is operative on a write-in data with a large number of parallel bits, and each of the write-in data port and the read-out data port are respectively divided into two parts WR1 and WR2 or RD1 and RD2. The write-in data lines 40 are bifurcated, and the branched data lines 40a and 40b are coupled to the two parts WR1 and WR2 of the write-in data port, and two parts RD1 and RD2 of the read-out data port are respectively coupled through auxiliary read-out data lines 50a and 50b to two input ports A and B of a selecting circuit 3. The selecting circuit 3 is responsive to a selecting signal S on a controlling signal line 60, and couples either auxiliary read-out data lines 50a and 50b to the read-out data lines 50 depending upon the selecting signal S. In the functional testing operation, a multi-bit write-in data on the write-in data lines 40 are distributed in parallel to the two parts WR1 and WR2, and a multi-bit read-out data on the auxiliary read-out data lines 50a and 50b are sequentially transferred through the selecting circuit 3 to the read-out data lines 50 in two installments. The read-out data lines 50 feed the multi-bit read-out data to the testing unit, and the read-out data bits thus sequentially fed to the testing unit are examined to see whether or not a trouble takes place in the single port random access memory device.

If a write-in data consists of much more parallel bits than that fed to the single port random access memory device 2, each of the write-in data port and the read-out data port 4 is divided into three parts WR1, WR2 and WR3 or RD1, RD2 and RD3 as shown in FIG. 3. The write-in data lines 40 are branched into three auxiliary write-in data lines 40a, 40b and 40c, and the auxiliary write-in data lines 40a, 40b and 40c are coupled to the three parts WR1, WR2 and WR3 of the write-in data port. The three parts RD1, RD2 and RD3 of the read-out data port are coupled in parallel to three input ports A, B and C of a selecting circuit 50 through auxiliary read-out data lines 50a, 50b and 50c, and the selector circuit 5 couples either auxiliary read-out data lines 50a, 50b, and 50c to the read-out data lines 50. When the functional testing operation is carried out, a multi-bit write-in data is distributed from the write-in data lines 40 through the auxiliary write-in data lines 40a, 40b and 40c to the parts WR1, WR2 and WR3, and a large number of bits of a read-out data is sequentially transferred through the selecting circuit 5 to the read-out data lines 50. The read-out data is also examined to see if the single port random access memory device destroys the write-in data or not.

Thus, the functional testing operation on the single port random access memory device 2 or 4 tends to be prolonged together with the data width. If the functional testing operation on the random access memory device 1 is completed at time t2 (see FIG. 4), the random access memory device 2 needs a prolonged time period from t1 to t3, and the random access memory device 4 prolongs the functional operation to time t4.

The testing unit is further used for a functional test on a plurality of single port random access memory devices 6 and 7 as shown in FIG. 5, and the testing unit is communicable with each of the signal port random access memory devices 6 and 7, because an acceptable write-in data is not larger in the number of parallel bits than the write-in data lines 40 as similar to the random access memory device 1. The address lines 30, the write-in data lines 40 and the controlling signal line 10 are shared between the single port random access memory devices 6 and 7, and the single port random access memory devices 6 and 7 are selectively activated with chip enable signals CE on the controlling signal lines 20a and 20b. The read-out data ports RD1 and RD2 are coupled through auxiliary readout data lines 50a and 50b to the two input ports A and B of a selecting circuit 8, and the selecting circuit 8 couples either auxiliary read-out data lines 50a or 50b to the read-out data lines 50 depending upon a controlling signal S on a controlling signal line 60.

In the functional testing operation, a multi-bit read-out data is transferred from the random access memory device 6 through the auxiliary read-out data line 50a and the selecting circuit 8 to the read-out data lines 50, and another multi-bit read-out data is, thereafter, fed from the single port random access memory device 7 through the auxiliary read-out data lines 50b and the selecting circuit 8 to the read-out data lines 50. Thus, the functional testing operation is also prolonged as shown in FIG. 4.

If a semiconductor integrated circuit selectively uses two sets of signal lines depending upon the mode of operation, a selecting unit 9 is provided in front of a single port random access memory device 11. Namely, first address bits, first multi-bit write-in data bits, a first write/read controlling signal and a first chip enable signal are respectively propagated through the address lines 30, the write-in data lines 40, the controlling line 10 and the controlling line 20 to first input ports Aa, Ab, Ae and Af in the functional testing mode, and second address bits, second multi-bit write-in data bits, a second write/read controlling signal and a second chip enable signal are respectively propagated through address lines 130, write-in data lines 140, a controlling line 110 and a controlling line 120 to second input ports Ba, Bb, Be and Bf in a usual mode of operation. The selecting circuit 9 is responsive to a selecting signal S on a controlling line 160, and the selecting circuit 9 couples one of the first and second ports Aa to Af or Ba to Bf to the address port AD, the write-in data port WR and the controlling signal port CTL of the random access memory device 11. The single port random access memory device 11 is similar in circuit behavior to the single port random access memory device 1, and is activated with the chip enable signal CE, i.e., either first or second chip enable signal. The random access memory device 11 writes a multi-bit write-in data into or reads out a multi-bit read-out data from memory cells designated by the address bits depending upon the write/read controlling signal W/R or either first or second write/read controlling signal.

If the data width is too wide to be supplied through the write-in data lines 30, two selecting circuits 12 and 13 are provided for a single port random access memory device 14 one of which is placed in front of the single port random access memory device 14 for selectively coupling two sets of signal lines 10 to 40 and 110 to 140, and the other of which is placed at the back of the single port random access memory device 14 for sequentially transferring a multi-bit read-out data to the read-out data lines 50 in two installments. The write-in data lines 40 is bifurcated, and the two branches 40a and 40b are respectively coupled to input ports Ab and Ac. The other write-in data lines 140a and 140b are as many as the parallel bits of a second multi-bit write-in data, and, for this reason, the write-in data lines 140a and 140b per se are coupled to input ports Bb and Bc without any branched lines. The output ports Xa, Xb, Xc, Xe and Xf are coupled in parallel to the address port AD, the two parts WR1 and WR2 of the write-in data port and the controlling port CTL of the single port random access memory device 14, and the selecting circuit 12 is responsive to a selecting signal on the controlling signal line 160, thereby coupling either first or second input ports Aa to Af or Ba to Bf to the single port random access memory device 14. The two parts RD1 and RD2 of the read-out data port are also coupled in parallel to the two input ports A and B of the selecting circuit 13, and the selecting circuit 13 is responsive to a selecting signal on the controlling signal line 60 so as to couple either input port A or B to the read-out data lines 50. While the semiconductor integrated circuit behaves in the usual mode of operation, the selecting circuit 15 couples the second group of signal lines 110 to 140c to the single port random access memory device 15.

However, if the semiconductor integrated circuit enters the functional testing mode of operation, the selecting signal S on the controlling line 160 causes the selecting circuit 12 to couple the input ports Aa to Af with the single port random access memory device 14, and the selecting circuit 13 sequentially transfers a multi-bit read-out data through the read-out data lines 50 to the testing unit in two installments. Therefore, the functional testing operation is prolonged to time t3 as shown in FIG. 4.

If the data width supplied to a multi-bit write-in port is more than twice as large as the write-in data lines 30, the write-in data lines 40 are trifurcated as shown in FIG. 8. Namely, a selecting circuit 15 selectively couples two sets of signal lines 10, 20, 30 and 40, and 110, 120, 130 and 140 to a single port random access memory device 16, and a selecting circuit 17 transfers a multi-bit read-out data to the read-out data lines 50 in two installments. As described hereinbefore, the write-in data lines 30 is too narrow to supply the multi-bit write-in data to the write-in data port of the single port random access memory device 16, and, for this reason, the three branches 40a, 40b and 40c of the write-in data lines 40 are coupled to input ports Ab, Ac and Ad. However, the write-in data lines 140a to 140c are directly coupled to input ports Bb, Bc and Bd, respectively, because the write-in data lines 140a to 140c can simultaneously propagate all of the second write-in data bits. When the selecting signal on the controlling signal line 160 is indicative of the usual mode of operation, the selecting circuit 15 interconnects the input ports Ba to Bf and the output ports Xa to Xf, and the second address bits, the second multi-bit write-in data, the second write/read controlling signal and the second chip enable signal are fed to the address port AD, the three parts of the write-in data port and the controlling signal port CTL. However, if the selecting signal on the controlling signal line 160 is indicative of the functional testing mode, the first multi-bit write-in data is distributed in parallel through the three branches 40a to 40c to the input ports Ab, Ac and Ad, and the selecting circuit 15 allows the first address bits, the first multi-bit write-in data, the first write/read controlling signal and the first chip enable signal to reach the address port AD, the three parts WR1 to WR3 of the write-in data port and the controlling signal port CTL. If the first write/read controlling signal causes the single port random access memory device 16 to enter the write-in mode, the first multi-bit write-in data is written into memory cells designated by the first address bits. However, if the first write/read controlling signal switches the single port random access memory device 16 to the read-out mode, a multi-bit read-out data is read out from memory cells designated by the address bits to the three parts RD1 to RD3 of the read-out data port, and the selecting circuit 17 sequentially transfers the read-out data to the read-out data lines 50 in three installments in response to the selecting signal on the controlling signal lines 60. The read-out data is examined to see whether or not a trouble takes place in the single port random access memory device 16. Since the read-out data is transferred to the read-out data lines 50 in three installments, the functional testing operation needs a prolonged time period from time t1 to time t4 as similar to that shown in FIG. 3.

In order to carry out the functional testing operation on two single port random access memory devices 18 and 19 incorporated in a semiconductor integrated circuit with three sets of signal lines, two selecting circuits 21 and 22 are respectively provided in front of the two signal port random access memory devices 18 and 19, and a selecting circuit is coupled between the two single port random access memory devices 18 and 19 and the read-out data lines 50. Each of the single port random access memory devices 18 and 19 has a write-in data port WR1 or WR2 the data width of which is equal to that of the write-in data lines 30. A first group of signal lines is used in the functional testing mode of operation, and consists of first address lines 30, first write-in data lines 40, a controlling signal line 10 for a first write/read controlling signal, and controlling signal lines 20 and 320 for first and fourth chip enable signals. Since the first address lines 30, the first write-in data lines 40 and the controlling signal line 10 are shared between the single port random access memory devices 18 and 19, all of these lines 30, 40 and 10 are bifurcated, and branches 30a, 40a and 10a, and 30b, 40b and 10b are respectively coupled to the selecting circuits 21 and 22. A second group of signal lines is used for the single port random access memory device 18 in a usual mode of operation, and consists of second address lines 130, second write-in data lines 140, a controlling signal line 110 for a second write/read controlling signal and a controlling signal line 120 for a second chip enable signal. The third group of signal lines are associated with the single port random access memory device 19 in the usual mode of operation, and consists of third address lines 230, third write-in data lines 240, a controlling signal line 210 for a third write/read controlling signal and a controlling signal line 220 for a third chip enable signal. A selecting signal 160 indicative of the usual mode causes the selecting circuits 21 and 22 to couple the second and third groups of the signal lines 110 to 140 and 210 to 240 to the signal port random access memory devices 18 and 19, respectively. A selecting signal 60 allows the selecting circuit 23 to couple either auxiliary read-out data lines 50a or 50b to the read-out data lines 50 in both modes of operation. If the semiconductor integrated circuit enters the functional testing mode, a multi-bit write-in data is transferred through the selecting circuit 21 to the single port random access memory device 18, and a multi-bit read-out data is supplied from the read-out data port RD1 through auxiliary read-out data lines 50a and the selecting circuit 23 to the read-out data lines 50. Thereafter, the multi-bit write-in data is transferred through the selecting circuit 22 to the single port random access memory device 19, and a multi-bit read-out data is fed from the read-out port RD2 through auxiliary read-out data lines 50b and the selecting circuit 23 to the read-out data lines 50. Thus, the functional testing operation consists of two phases, and is completed at time t3 as shown in FIG. 4.

Various prior art semiconductor integrated circuits have been described and examined hereinbefore, and it will be understood that the prior art semiconductor integrated circuit consumes a prolonged time period for the functional testing operation if the data width or the number of random access memory devices are increased.

SUMMARY OF THE INVENTION

It is therefore an important object of the present invention to provide a semiconductor integrated circuit which completes a functional testing operation on a random access memory unit within a relatively short time period.

To accomplish these objects, the present invention proposes to preliminary compare parallel read-out bit groups or a plurality of read-out data with one another to see whether consistency or inconsistency takes place therebetween.

In accordance with one aspect of the present invention, there is provided a semiconductor integrated circuit communicable with a testing unit in a functional testing mode of operation, the testing unit producing a multi-bit testing data, comprising: a) a memory circuit having a multi-bit write-in data port for a multi-bit write-in data, and a multi-bit read-out data port for a multi-bit read-out data, the write-in data port being divided into a plurality of parts, the read-out data port being divided into a plurality of parts; b) write-in data lines equal in number to parallel bits of the multi-bit testing data and supplied with the multi-bit testing data in the functional testing mode of operation; c) a plurality of auxiliary write-in data line groups each consisting of auxiliary write-in data lines equal in number to the write-in data lines, and coupled in parallel between the write-in data lines and the plurality of parts of the multi-bit write-in data port; d) a plurality of read-out data line groups respectively coupled to the plurality of parts of the multi-bit read-out data port for propagating the multi-bit read-out data, one of the plurality of read-out data line groups being further coupled to the testing unit; and e) a comparator unit having a plurality of input ports respectively coupled to the plurality of read-out data line groups, and operative to compare read-out data bits on one of the plurality of read-out data line groups with read-out data bits on the other of the plurality of read-out data line groups for producing a reporting signal indicative of consistency or inconsistency between the read-out data bits on the aforesaid one of the plurality of read-out data line groups and the read-out data bits on the other of the plurality of read-out data line groups, the reporting signal being fed to the testing unit, wherein the testing unit checks the read-out data bits on the aforesaid one of the plurality of read-out data line groups and the reporting signal to see whether or not a trouble takes place in the memory circuit.

In accordance with another aspect of the present invention, there is provided a semiconductor integrated circuit communicable with a testing unit in a functional testing mode of operation, the testing unit producing a multi-bit testing data, comprising: a) a plurality of memory circuits each having a multi-bit write-in data port for a multi-bit write-in data, and a multi-bit read-out data port for a multi-bit read-out data; b) write-in data lines equal in number to parallel bits of the multi-bit testing data and propagating the multi-bit testing data;

d) a plurality of auxiliary write-in data line groups each consisting of auxiliary write-in data lines equal in number to the write-in data lines, the plurality of auxiliary write-in data line groups being coupled between the write-in data lines and the write-in ports of the plurality of memory circuits; e) a plurality of read-out data line groups each coupled to the multi-bit read-out data port of one of the memory circuits, one of the read-out data line groups being further coupled to the testing unit; and f) a comparator unit having a plurality of input ports respectively coupled to the plurality of read-out data line groups, and operative to compare read-out data bits on one of the plurality of read-out data line groups with data bits on the other of the plurality of read-out data line groups for producing a reporting signal indicative of consistency or inconsistency between the read-out data bits on the aforesaid one of the plurality of read-out data line groups and the read-out data bits on the other of the plurality of read-out data line groups, the reporting signal being fed to the testing unit, wherein the testing unit checks the read-out data bits on the aforesaid one of the plurality of read-out data line groups and the reporting signal to see whether or not a trouble takes place in the plurality of memory circuits.

BRIEF DESCRIPTION OF THE DRAWINGS

The features and advantages of the semiconductor integrated circuit according to the present invention will be more clearly understood from the following description taken in conjunction with the accompanying drawings in which.

DESCRIPTION OF THE PREFERRED EMBODIMENTS

First Embodiment

Figure 1:
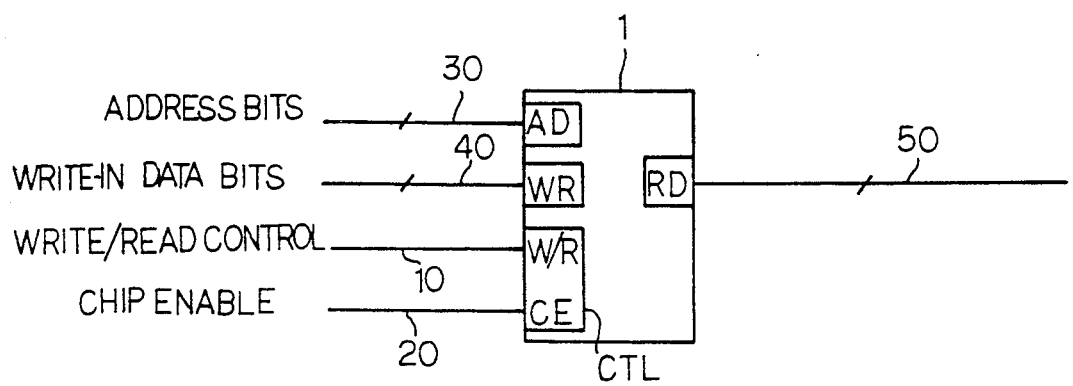
FIG. 1 is a diagram showing a prior art wiring arrangement around a single port random access memory device incorporated in a semiconductor integrated circuit.
Figure 2:
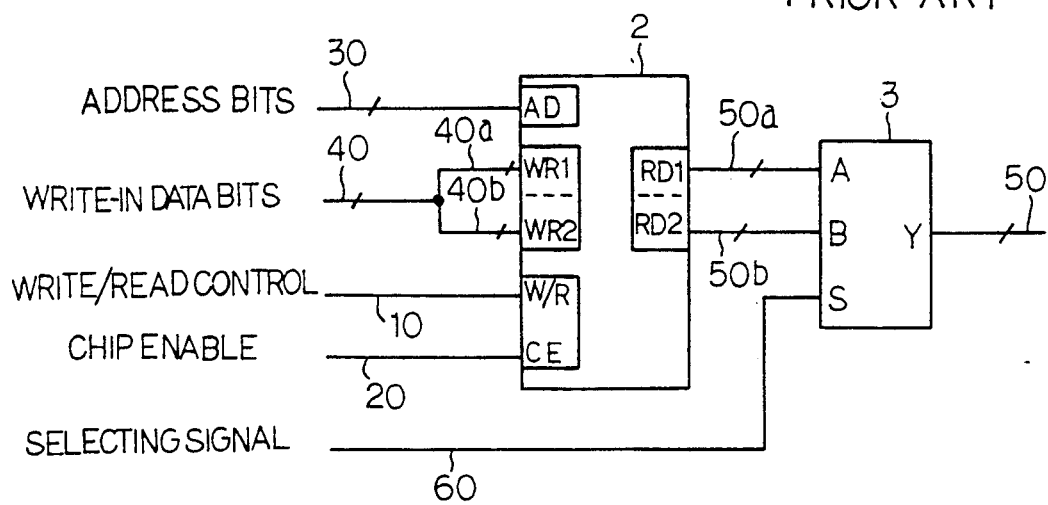
FIG. 2 is a diagram showing another prior art wiring arrangement around a single port random access memory device incorporated in a semiconductor integrated circuit.
Figure 10:
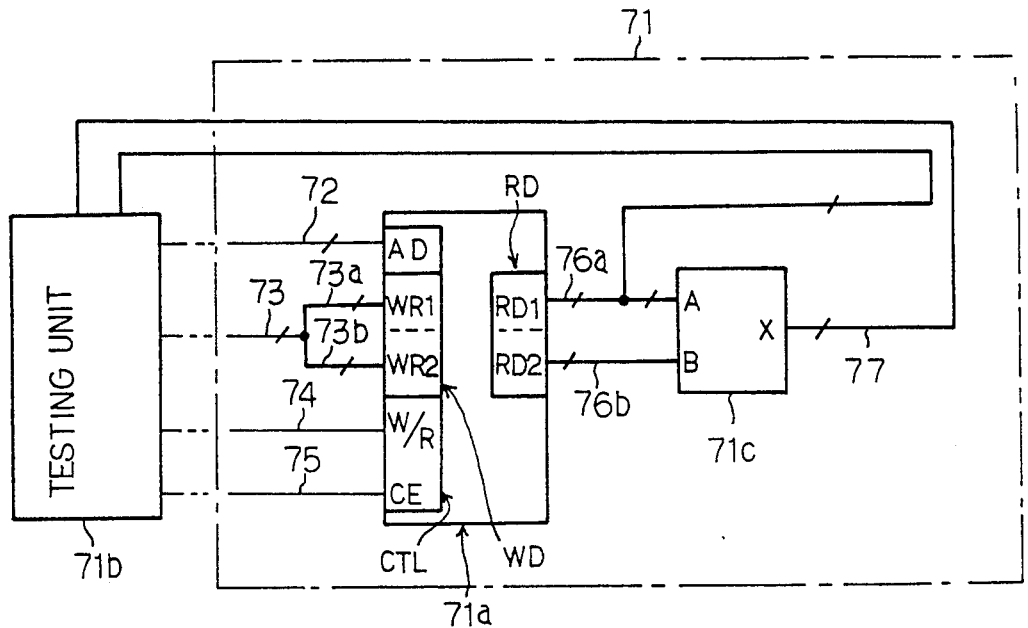
FIG. 10 is a diagram showing the arrangement of a semiconductor integrated circuit implementing a first embodiment according to the present invention.

Referring to FIG. 10 of the drawings, a semiconductor integrated circuit 71 largely comprises a single port random access memory circuit 71a communicable with a testing unit 71b, and a comparator 71c, and selectively enters an usual mode and a functional testing mode of operation. The testing unit 71b is coupled through address lines 72, write-in data lines 73 and a write/read controlling line 74 and a chip enable line 75 to an address port AD, a write-in data port WD and a controlling port CTL of the single port random access memory circuit 71a. The write-in data port WD is separated into two parts WR1 and WR2, and auxiliary write-in data lines 73a and 73b are coupled to the two parts WR1 and WR2 of the write-in data port WD. The single port random access memory circuit 71a further has a read-out data port RD consisting of two parts RD1 and RD2; and the two parts RD1 and RD2 are respectively coupled to two sets of read-out data lines 76a and 76b, and the two sets of read-out data lines 76a and 76b in turn are coupled to two input ports A and B of a comparator circuit 71c. The read-out data lines 76a is bifurcated, and is further coupled to an input port of the testing unit 71b. An output port X of the comparator circuit 71c is coupled to reporting lines 77 to the input port of the microprocessor 71b. Only half of the parallel read-out data bits of the read-out data as well as the reporting signal are fed to the input port of the microprocessor 71b, and only reporting lines 77 are additionally provided to the semiconductor integrated circuit 71 as long as the read-out data is equal in number to that of the prior art semiconductor integrated circuit shown in FIG. 2.

The single port random access memory circuit 71a memorizes a multi-bit write-in data in a single write-in operation, and the number of parallel bits of the write-in data is equal to the total number of the auxiliary write-in data lines 73a and 73b. Since the write-in data lines 73 are bifurcated into the auxiliary write-in data lines 73a and 73b, the write-in data lines 73 are as small in number as each auxiliary write-in data lines 73a or 73b. Therefore, the write-in data lines 73, 73a and 73b are equal in number to those of the prior art semiconductor integrated circuit shown in FIG. 2.

Assuming now that the semiconductor integrated circuit 71 enters the functional testing mode of operation, the testing unit 71b shifts the write/read controlling line 74 to a predetermined level indicative of the write-in mode, and enables the single port random access memory circuit 71a with the enable signal line 75. The testing unit 71b supplies a multi-bit testing data to the write-in data lines 73, and the multi-bit testing data is distributed in parallel through the auxiliary write-in data lines 73a and 73b to the write-in data port WD. The testing unit 71a sequentially increments the address indicated by the address bits, and the multi-bit testing data is sequentially written into all of the memory cells of the single port random access memory circuit 71a. The testing unit 71b changes the write/read controlling signal W/R so that the single port random access memory circuit 71a enters the read-out mode. The testing unit 71b sequentially increments the address again, and, accordingly, a multi-bit read-out data takes place at the read-out port RD in every read-out operation. The multi-bit read-out data is split into two parallel bit groups, and are compared with each other by the comparator circuit 71c to see whether or not one of the two parallel bit groups is consistent with the other parallel bit group. If the two parallel bit groups are consistent, the comparator 71c produces the reporting signal indicative of the consistency, and the reporting signal and the parallel bit group on the read-out data lines 76a are fed to the testing unit 71b If the two parallel bit groups are (11010) and (11010), the reporting signal is (11111). However, if the two parallel data bit groups are inconsistent, the comparator produces the reporting signal indicative of the inconsistency, and the reporting signal indicative of the inconsistency is fed to the testing unit 71b together with the parallel bit group. For example, if the two parallel bit groups are (11010) and (11000), the reporting signal is (11101), and bit "0" is representative of inconsistency between two bits. Various signal lines are further incorporated in the semiconductor integrated circuit 71; however, these signal lines are deleted for the sake of simplicity.

The testing unit 71b examines the single port random access memory circuit 71a as follows. If one of the read-out bit of the parallel bit group is opposite in logic level to the corresponding read-out bit of the other parallel bit group, the reporting signal is indicative of the inconsistency as described hereinbefore, and the testing unit 71b finds that one of the memory cells is defective or the single port random access memory circuit 71a has a trouble. If the parallel bit group fed thereto is compared with half testing data, the testing unit can identify the defective memory cell in consideration with the reporting signal. Even if the single port random access memory circuit 71a has a trouble, the reporting signal may be indicative of the consistency. Namely, if two defective memory cells are located at the corresponding locations of the parallel bit groups, the parallel bit groups are consistent with each other, and the reporting signal is indicative of the consistency. However, when the parallel bit group is compared with half testing data, the testing unit 71b can find the defective memory cells. Thus, all of the parallel bits of the read-out data are examined in a single read-out operation, and, accordingly, the functional test is completed at time t2. Since the single port random access memory circuit 71a corresponds to the prior art single port random access memory device 2, the functional test is surely shrunk in accordance with the present invention.

Second Embodiment

Figure 11:
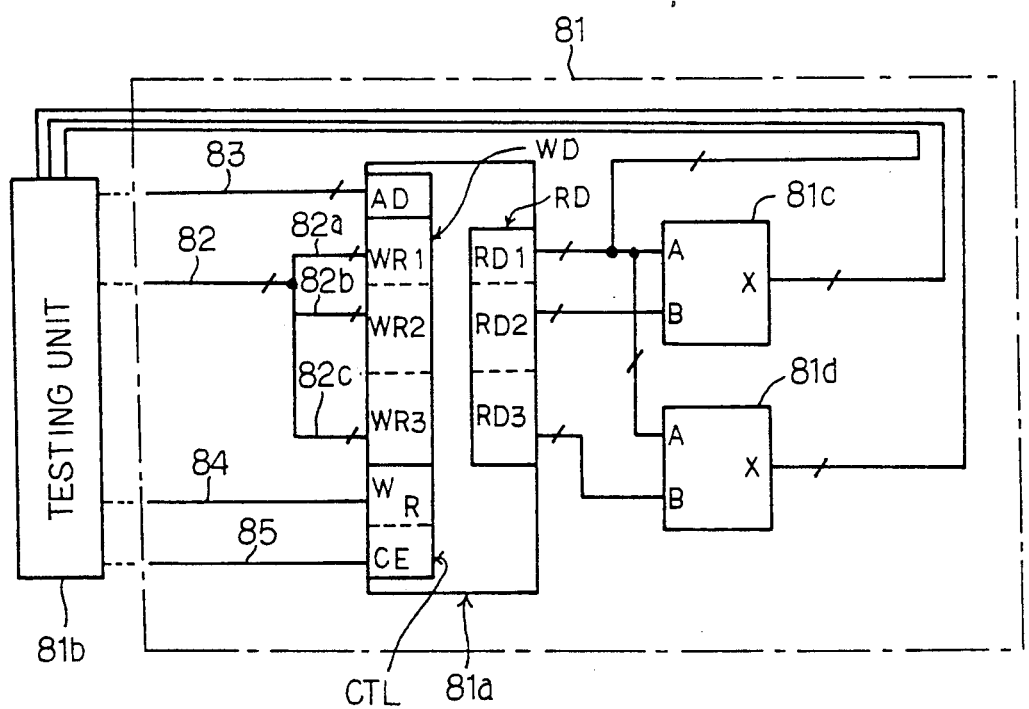
FIG. 11 is a diagram showing the arrangement of another semiconductor integrated circuit implementing a second embodiment according to the present invention.

Turning to FIG. 11, another semiconductor integrated circuit 81 embodying the present invention largely comprises a single port random access memory device 81a communicable with a testing unit 81b, and two comparator circuits 81c and 81d. Since the single port random access memory device 81a has a write-in data port WD which is available for a write-in data larger in the number of parallel bits than the write-in data supplied to the semiconductor integrated circuit 71. However, the testing unit 81b corresponds to the testing unit 71b, and, accordingly, write-in data lines 82 are equal in the number to the write-in data lines 73. In order to distribute a multi-bit testing data through the write-in data lines 82 to the write-in data port WD, the write-in data port WD is virtually divided into three parts WR1, WR2 and WR3, and the write-in data lines 82 are coupled in parallel through three sets of auxiliary write-in data lines 82a, 82b and 82c to the associated parts WR1, WR2 and WR3 of the write-in data port WD. Address bits are propagated through address lines 83 to an address port AD of the single port random access memory device 81a, and controlling signal lines 84 and 85 supply a write/read controlling signal W/R and a chip enable signal CE to a controlling port CTL. A multi-bit write-in data or the multi-bit testing data is written into memory cells indicated by address bits in the presence of the write/read controlling signal W/R of a predetermined level indicative of the write-in mode, and a multi-bit read-out data is read out from the memory cells designated by the address bits to a read-out data port RD. The read-out data port Rd is also virtually divided into three parts RD1, RD2 and RD3, and the first part RD1 is coupled to a first input port A of the comparator circuit 81c, a first input port A of the comparator circuit 81d and an input port of the testing unit 81b. The second and third parts RD2 and RD3 are coupled to the second input ports B of the comparator circuits 81c and 81d, compare the parallel bits at the first input ports A with the parallel bits at the second input ports B, respectively. If parallel bits at the first input port A are consistent with parallel bits at the second input port B, each comparator circuit 81c or 81d produces a reporting signal indicative of the consistency; however, if not, the reporting signal is indicative of inconsistency. Other signal lines are further incorporated in the semiconductor integrated circuit 81. However, these signal lines are deleted from FIG. 11, because they are not directly related to the gist of the present invention.

The semiconductor integrated circuit 81 similarly behaves in a functional testing mode of operation to the semiconductor integrated circuit 71, and, for this reason, no further description is made on the circuit behavior of the semiconductor integrated circuit 71.

Figure 3:
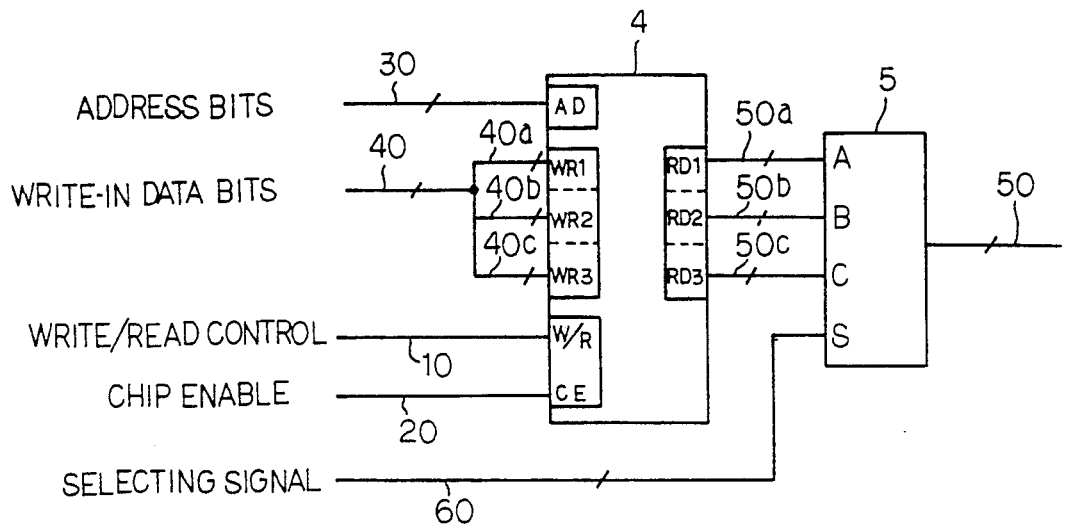
FIG. 3 is a diagram showing yet another wiring arrangement around a single port random access memory device incorporated in a semiconductor integrated circuit.
Figure 5:
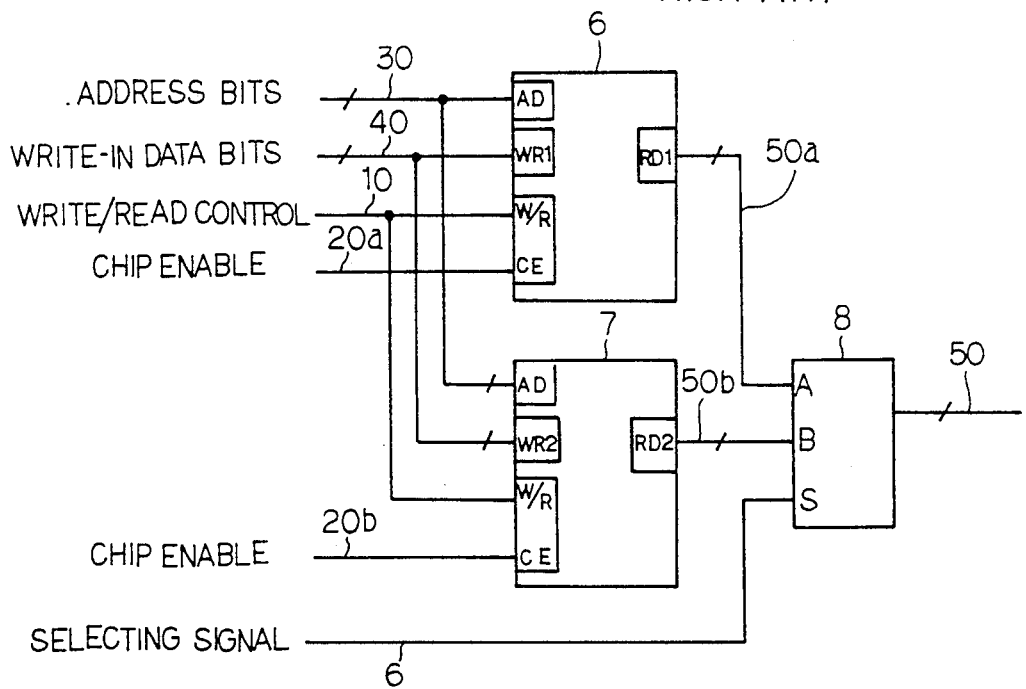
FIG. 5 is a diagram showing yet another prior art wiring arrangement around two single port random access memory devices incorporated in a semiconductor integrated circuit
Figure 6:
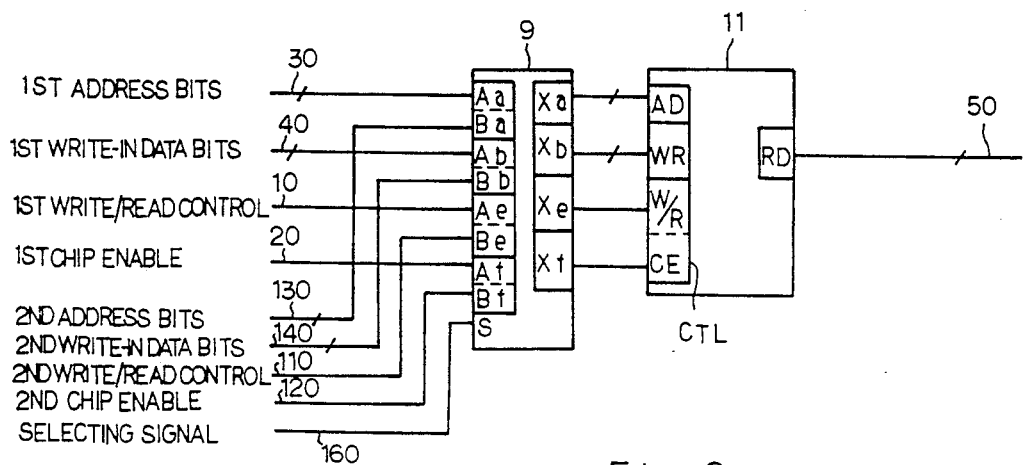
FIG. 6 is a diagram showing yet another prior art wiring arrangement around a random access memory device incorporated in a semiconductor integrated circuit associated with two sets of signal lines.
Figure 7:
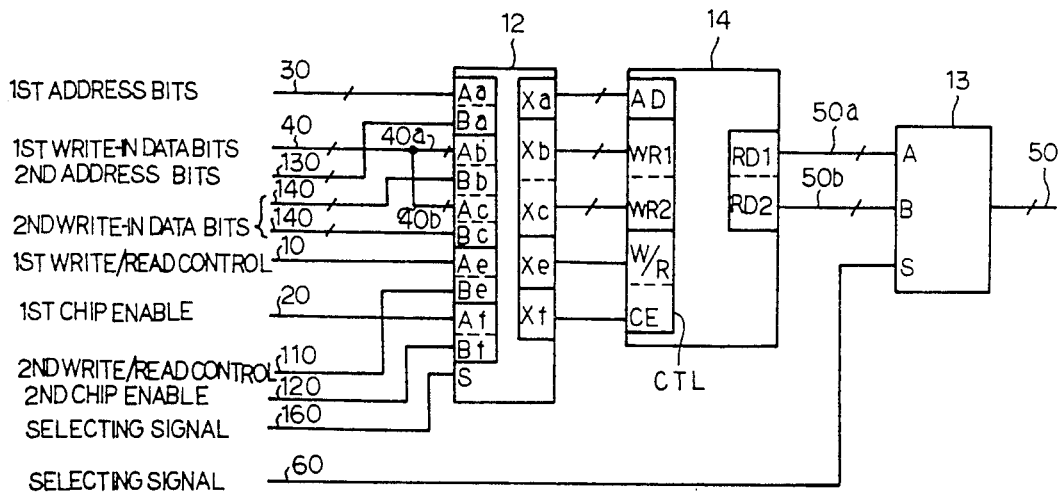
FIG. 7 is a diagram showing yet another prior art wiring arrangement around a random access memory device incorporated in a semiconductor integrated circuit associated with two sets of signal lines.
Figure 8:
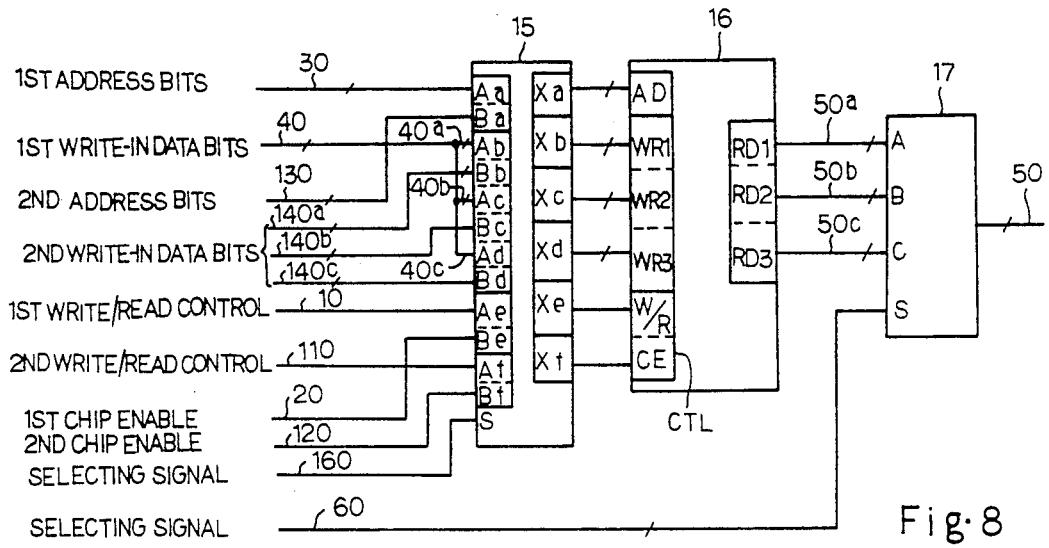
FIG. 8 is a diagram showing yet another prior art wiring arrangement around a random access memory device incorporated in a semiconductor integrated circuit associated with two sets of signal lines.

The single port random access memory device 81a corresponds to the prior art single port random access memory device 4 shown in FIG. 3 in view of the acceptable write-in data width. However, the functional testing mode of operation is completed within a short time period from time t1 to time t2, and is, accordingly, shrunk rather than the functional testing operation from time t1 to time t4 consumed by the prior art single port random access memory device 4.

Third Embodiment

Figure 12:
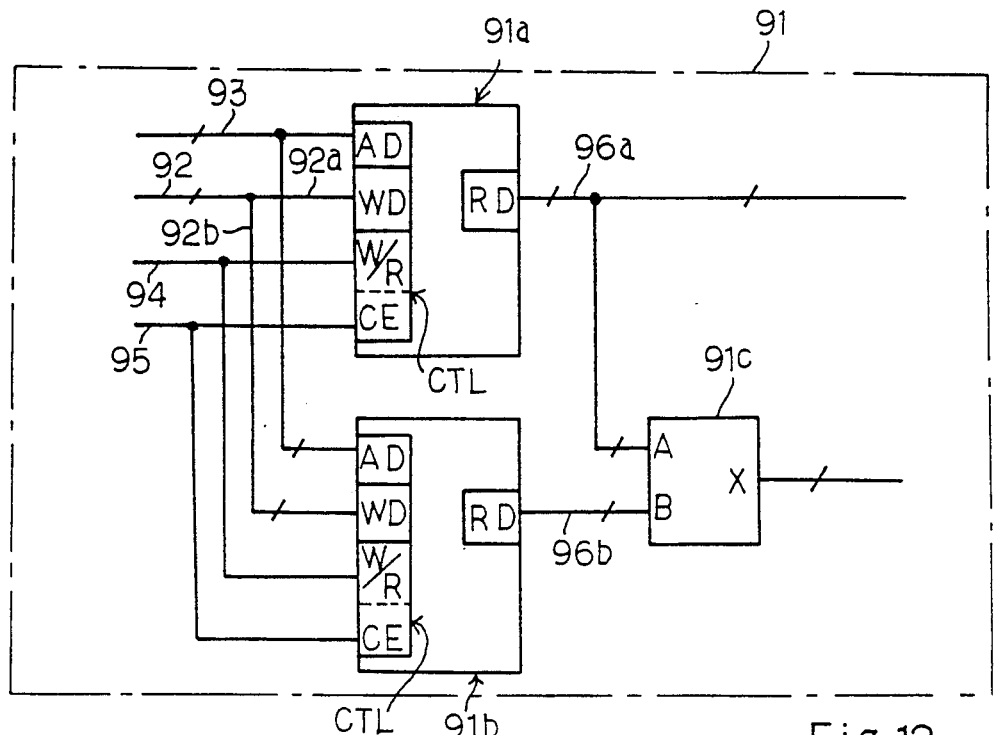
FIG. 12 is a diagram showing the arrangement of yet another semiconductor integrated circuit implementing a third embodiment according to the present invention.

Turning to FIG. 12, yet another semiconductor integrated circuit 91 embodying the present invention is implemented by two single port random access memory devices 91a and 91b coupled to a comparator circuit 91c. Although not shown in FIG. 12, a testing unit is provided in association with the single port random access memory devices 91a and 91b and the comparator circuit 91c, and the semiconductor integrated circuit 91 selectively enters a functional testing mode and usual mode of operation. Each of the single port random access memory devices 91a and 91b has a write-in data port WD not larger in the number of acceptable parallel bits than write-in data lines 92. For this reason, auxiliary write-in data lines 92a are equal in the number to the write-in data lines 92, and are coupled between the write-in data lines 92 and the write-in data port WD of the single port random access memory device 91a. Another set of auxiliary write-in data lines 92b are provided for the single port random access memory device 91b, and are also equal in the number to the write-in data lines 92. The auxiliary write-in data lines 92a and 92b propagate a multi-bit write-in data from the write-in data lines 92 to the single port random access memory devices 91a and 91b, respectively. The single port random access memory devices 91a and 91b have respective address ports AD supplied from address lines 93 with address bits, and respective controlling ports CTL supplied from controlling signal lines 94 and 95 with a write/read controlling signal W/R and a chip enable signal CE. The single port random access memory devices 91a and 91b are concurrently activated with the chip enable signal CE, and a multi-bit write-in data is written into the single port random access memory devices 91a and 91b in the presence of the write/read controlling signal indicative of the write-in mode of operation.

The single port random access memory devices 91a and 91b further have respective read-out data ports RD which are coupled through two sets of read-out data lines 96a and 96b to first and second input ports A and B of the comparator circuit 91c. The read-out data lines 96a are further coupled to the testing unit. The comparator circuit 91c compares the read-out data at the first input port A with the read-out data at the second input port B, and produces a reporting signal indicative of consistency or inconsistency.

If the semiconductor integrated circuit 91 enters a functional testing mode of operaiton, the chip enable signal CE activates both of the single port random access memory devices 91a and 91b, and the write/read controlling signal W/R causes the single port random access memory devices 91a and 91b to enter write-in mode. The testing unit supplies a multi-bit testing data to the write-in data lines 92, and the auxiliary write-in data lines 92a and 92 distribute the testing data to the write-in data ports WD of the single port random access memory devices 91a and data is concurrently written into the single port random access memory devices 91a and 91b. When all of the memory cells of the single port random access memory devices 91a and 91b memorize the testing data, the testing unit causes the single port random access memory devices 91a and 91b with the write/read controlling signal W/R indicative of the read-out mode of operation. With the address bits sequentially incremented, the testing data is read out as a read-out data, and the read-out data is fed from the read-out port RD of the single port random access memory device 91a through the read-out data lines 96a to the first input port of the comparator 91c. The read-out data on the Another read-out data is transferred from the read-out port RD of the single port random access memory device 91b through the read-out data lines 96b to the second input port of the comparator 91c, and is compared with the read-out data fed from the single port random access memory device 91a. If the comparator circuit 91c finds consistency, a reporting signal of the comparator circuit 91c is indicative of the consistency. However, if not, the reporting signal is indicative of the inconsistency. The testing unit concurrently examines the memory cells of the single port random access memory devices 91a and 91b with the read-out data fed from the read-out data lines 96a as well as the reporting signal. Thus, the testing unit concurrently examines the two single port random access memory devices 91a and 91b, and the functional testing operation is completed by time t2 (see FIG. 4).

Fourth Embodiment

Figure 13:
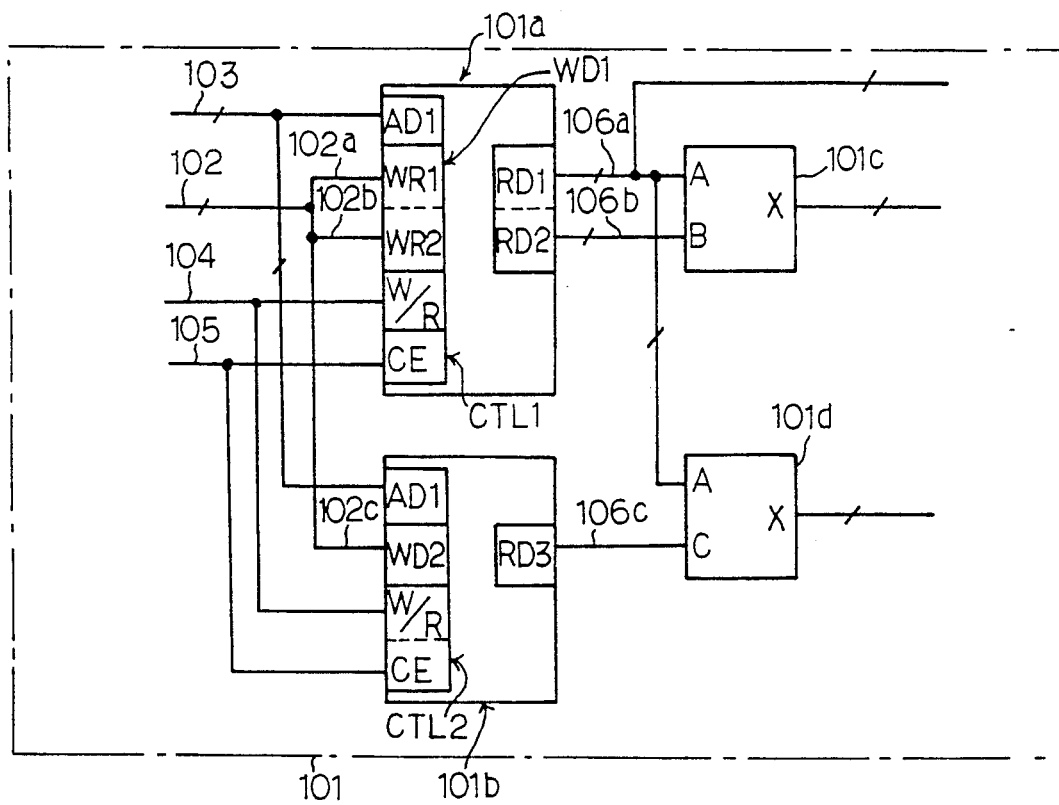
FIG. 13 is a diagram showing the arrangement of yet another semiconductor integrated circuit implementing a fourth embodiment according to the present invention.

Turning to FIG. 13, yet another semiconductor integrated circuit 101 embodying the present invention comprises two single port random access memory devices 101a and 101b, and comparator circuits 101c and 101d respectively provided for the single port random access memory devices 101a and 101b. An testing unit (not shown) is provided in association with the random access memory devices 101a and 101b, and examines the single port random access memory devices 101a and 101b to see whether or not a defective memory cell is incorporated in the single port random access memory devices 101a and 101b. The single port random access memory device 101a is similar to the single port random access memory device 71a in view of the acceptable parallel bits of the write-in data port WD thereof, and the single port random access memory device 101b corresponds to the single port random access memory device 91a or 91b. Therefore, the fourth embodiment is of a compromise between the first and third embodiments.

The single port random access memory device 101a has a write-in data port WD1 an acceptable write-in data of which is larger in the number of parallel bits than write-in data lines 102. However, the single port random access memory device 101b has a write-in data port WD2 an acceptable write-in data of which is equal in the number of the parallel bits to the write-in data lines 102. The write-in data lines 102 is branched into three sets of auxiliary write-in data lines 1002a, 102b and 102c, and the three sets of auxiliary write-in data lines are respectivley coupled to two parts WR1 and WR2 of the write-in data port WD1 as well as the write-in data port WD2. Address lines 103 are bifurcated, and are coupled to addres ports AD1 and AS2 of the single port random access memory devices 101a and 101b, respectively, Controlling signal lines 104 and 105 are shared between controllling ports CTL1 and CTL2 of the single port random access memory devices 101a and 101b, and a write/read controling signal W/R and a chip enable siganl CE are simultaneously supplied to the controling ports CTL1 and CTL2.

The single port random access memory device 101a has two parts RD1 and RD2 of a read-out data port coupled thorugh two sets of read-out data lines 106a and 106b to two input ports A and B of the comparator circuit 101c, and the comparator circuit 101c compares the parallel bits at the input port A with the parallel bits at the other input port B for producing a reporting signal indiative of either consistency or inconsistency at an output port X thereof. The read-out data lines 106a is further coupled to an input port of the exmainer as well as an input port of the comparator 101d, and an read-out port RD3 of the single port random access memory device 101b is coupled to another input port of the comparator 101d. The comparator circuit 101d compares the paralle bits at the input port A with the parallel bits at the input port C, and produces a reporting siganl indicative of either consistency or inconsistency.

Figure 4:
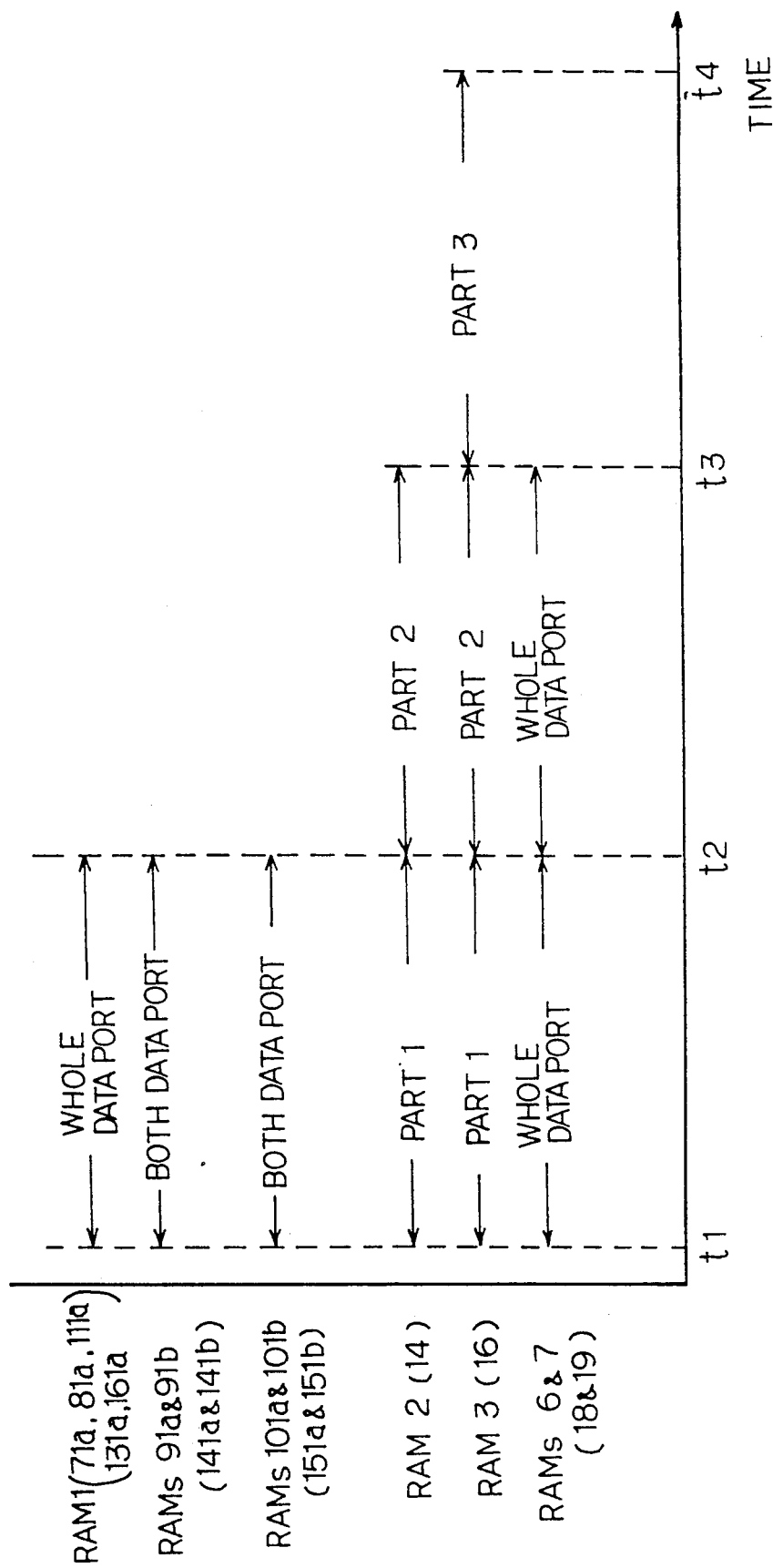
FIG. 4 is a timing chart showing functional testing operations on random access memory devices.

In a functional testing mode of operation, the single port random access memory devices 101a and 101b are concurrently enabled with the chip enalbe signal CE, and the write/read controlling signal W/R causes the single port random access memory devices 101a and 101b to simultaneously enter the write-in mode of oepraiton. The testing unit supplies a multi-bit testing data to the write-in data lines 102, and the multi-bit testing data is distributed to the write-in data ports WD1 and WD2. When the address indicated by the address bits is incremented, the multi-bit testing data is sequentially written into both of the single port random access memory devices 101a and 101b. After writing the testing data, the single port random access memory devices 101a and 101b are shifted to the read-out mode, and the address is sequentially incremented so that the testing data is read-out as a read-out data. The parallel bits on the read-out data lines 106a are directly transferred to the testing unit, and the other parallel bits on the read-out data lines 106b and the read-out data on the read-out data lines 106c are compared with the parallel bits on the read-outdata lines 106a by the comparator circuits 101c and 101d. The reporting signals each indicative of either consistency or inconsistency are fed to the testing unit, and the testing unit examines to see whether or not any defective memory cell is incorporated in the single port random access memory devices 101a and 101b. Thus, the single port random access memory devices 101a and 101b are simultaneously examined, and the functional testing operation is completed at time t2 as shown in FIG. 4.

Fifth Embodiment

Figure 14:
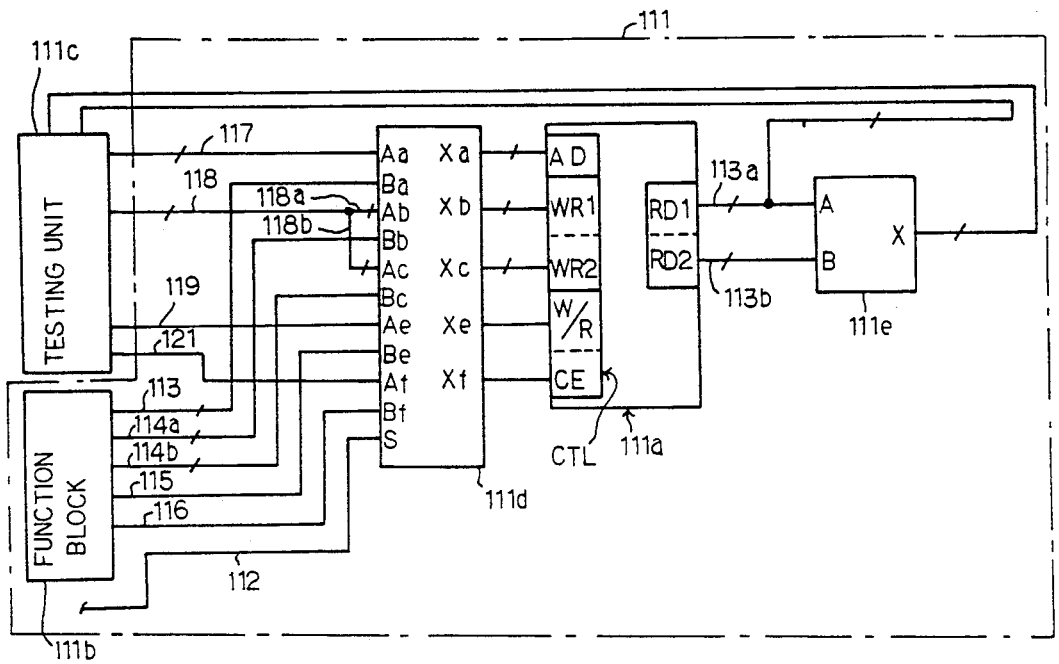
FIG. 14 is a diagram showing the arrangement of yet another semiconductor integrated circuit implementing a fifth embodiment according to the present invention.

Turning to FIG. 14, yet another semiconductor integrated circuit 111 comprises a single port random access memory device 111a, a function block 111b, a selecting circuit 111d and a comparator circuit 111e, and the single port random access memory device 111a selectively enters a functional testing mode and a usual mode of operation. In this instance, the function block 111b serves as an electronic circuit. In the usual mode of operation, the single port random access memory device 111a is communicable with the function block 111b, and a testing unit 111c examines the random access memory device 111a in the functional testing mode of operation. For this reason, the selecting circuit 111d is provided in association with the function block 111b and the testing unit 111c, and selectively couples either function block 111b or testing unit 111c with the single port random access memory device 111a depending upon a selecting signal S on a selecting signal line 112. In FIG. 14, each suffix "a" to "f" in the block 111d indicates that the ports are connectable, and suffixes in a block indicative of a selecting circuit are used in the similar manner in another embodiment described hereinbelow. Namely, the input port Aa or Ba is connectable with the output port Xa. The comparator circuit 111e is coupled through two sets of read-out data lines 113a and 113b with two parts RD1 and RD2 of a read-out port of the single port random access memory device 111a, and the comparator circuit 111e compares parallel bits on the read-out data lines 113a with parallel bits on the read-out data lines 113b for producing a reporting signal indicative of either consistency or inconsistency. The parallel bits on the read-out data lines 113a and the reporting signal are fed to an input port of the testing unit 111c to see whether or not a defective memory cell is incorporated in the single port random access memory device 111a.

The function block 111b produces address bits designating memory cells of the single port random access memory device 111a, a multi-bit write-in data, a write/read controlling signal and a chip enable signal, and address lines 113, write-in data lines 114a and 114b and controlling signal lines 115 and 116 are coupled between the function block 111b and input ports Ba, Bb, Bc, Bd, Be and Bf of the selecting circuit 111d. Similarly, the address assigned to a group of the memory cells, a multi-bit testing data, a write/read controling signal and a chip enable signal, and, accordingly, address lines 117, testing data lines 118, and controlling signal lines 119 and 120 are coupled between the testing unit 111c and other input ports Aa, Ab, Ac, Ad, Ae and Af of the selecting circuit 111d. The selecting circuit 111d is responsive to the seelcting signal S, and selectively interconnects either input ports Aa to Af or Ba to Bf and output ports Xa, Xb, Xc, Xd, Xe and Xf. The output ports Xa to Xf are respectively coupled to an address port AD, parts WR1 and WR2 of a write-in port and a controlling port CTL. The wrte-in data is equal in the number of parallel bits to the write-in data port WR1 and WR2. However, the testing data lines 118 are as half in the number as the write-in data port WR1 and WR2, and, for this reason, the testing data lines 118 are branched into two sets of auxiliary write-in data lines 118a and 118b, and the two sets of auxiliary write-in data lines 118a and 118b are coupled to the inpput ports Ab and Ac, respectively. Thus, the multi-bit testing data is distributed to the input ports Ab and Ac and, accordingly, to the two parts WR1 and WR2 of the write-in data port. Although various function blocks as well as associated signal lines are further incorproated in the semiconductor integratd circuit 111, these are deleted from FIG. 14 for the sake of simplicity.

If the semiconductor integrated circuit 111 is in the usual mode of operation, the selecting signal S causes the selecting circuit 111d to interconnect the input ports Ba to Bf and the single port random access memory device 111a, and the function block 111b achieves a predetermined task in communication with the single port random access memory device 111a.

However, if the functional testing mode is established in the semiconductor integrated circuit 111, the selecting signal S causes the selecting cirucit 111d to couple the input ports Aa to Af with the single port random access memory device 111a, and the testing unit 111c activates the single port random access memory device 111a with the chip enable siganl CE. The testing unit 111c further establishes the write-in mode with the write/read controlling signal W/R, and, then, supplies a multi-bit testing data to the write-in data lines 118. The multi-bit testing data is distributed through the auxiliary write-in data lines 118a and 118b to the two parts WR1 and WR2 of the write-in data port. The testing unit 111c increments the address indicated by the address bits, and the multi-bit testing data is sequentially written into all of the memory cells of the single port random access memory device 111a. Upon completion of the write-in operation, the testing unit 111c establishes the read-out mode with the write/read controlling signal W/R, and sequentially increments the address indicated by the address bits. Then, the testing data is read-out from the memory cells designated by the address bits as a multi-bit read-out data in every read-out operation, and the parallel bits are transferred through the two sets of read-out data lines 113a and 113b to the two input ports A and B of the comparator circuit 111e. If the paralle bits at the input port A are consistent with the parallel bits at the input port B, the comparator circuit 111e produces the reporting signal indicative of the consistency. For example, the paralle bits on the read-out data lines 113a are (11010), and the parallel bits on the read-out data lines 113b are (11010). Then, the reporting signal is (0). However, if not, the comparator circuit 111e produces the reporting siganl indicative of the incensistency. For example, if the parallel bits on the read-out data lines 113b are (11000), the reporting signal is (1). The paralle bits on the read-out data lines 1113a and the reporting signal are fed to the input port of the testing unit 111c, and the testing unit examines to see if a trouble takes place in the single port random access memory device 111a. The functional testing operation is completed at time t2 (see FIG. 4). Since the single port random access memory device 111a corresponds to the prior art random access memory device 2, the functional testing operation is surely shrunk in accordance with the present invention.

Sixth Embodiment

Figure 15:
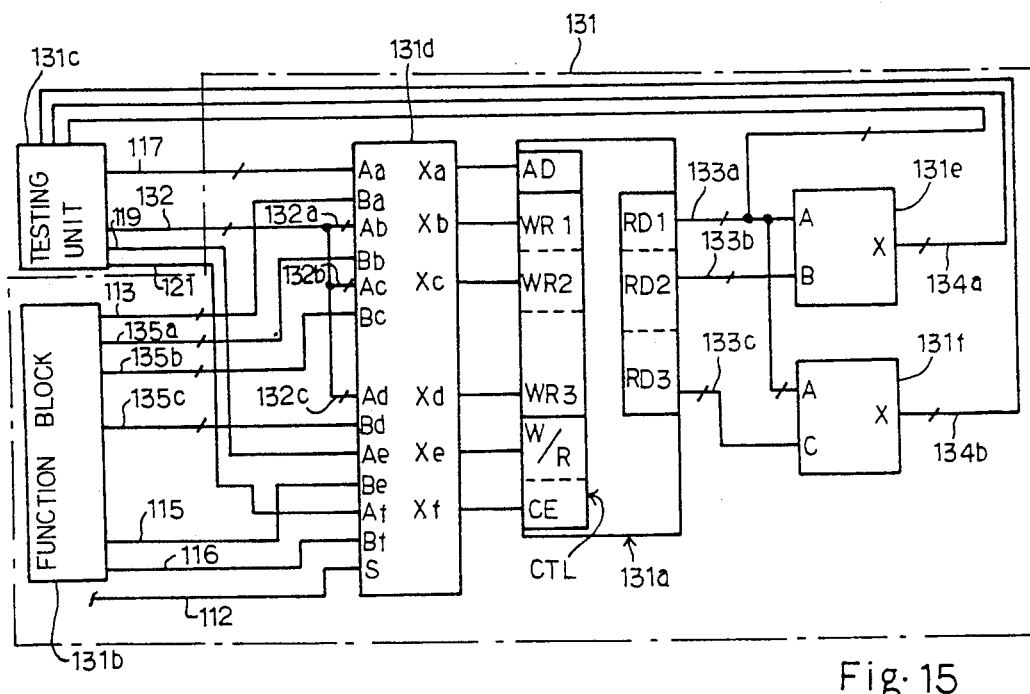
FIG. 15 is a diagram showing the arrangement of yet another semiconductor integrated circuit implementing a sixth embodiment according to the present invention.

Turning to FIG. 15, a semiconductor integrated circuit 131 embodying the present invention comprises a single port random access memory device associated with a function block 131b and a testing unit 131c. A selecting circuit 131d is provided in association with the function block 131b and the testing unit 131c so that the function block 131b and the testing unit 131c are selectively coupled to the single port random access memory device 131a depending upon mode of operation. Since an acceptable write-in data for the single port random access memory device 131a is larger in the number of parallel bits than the acceptable write-in data for the single port random access memory device 111a, the write-in data lines 132 is branched into three sets of write-in data lines 132a, 132b and 132c coupled to three parts WR1, WR2 and WR3 of a write-in data port of the single port random access memory device 131a, and two comparator circuits 131e and 131f are provided in association with two parts RD1 and RD2 of a read-out port. Three sets of read-out data lines 133a, 133b and 133c couple the three parts RD1 to RD3 with input ports A, B and C of the comparator circuits 131e and 131f, and the read-out data lines 133a are further coupled to an input port of the testing unit 131c together with reporting lines 134a and 134b. Three sets of write-in data lines 135a, 135b and 135c propagates a multi-bit write-in data from the function block 131b to the selecting circuit 131d, because the acceptable write-in data is wider than that of the fifth embodiment. However, other arrangement is similar to the fifth embodiment, and, for this reason, the same references used in the fifth embodiment designate corresponding components without any detailed description.

Only difference between the fifth and sixth embodiments is the number of the parallel bits acceptable for the write-in data port, and the sixth embodiment behaves as similar to the fifth embodiment. This is the reason why no further description is incorporated hereinbefore.

Seventh Embodiment

Figure 16:
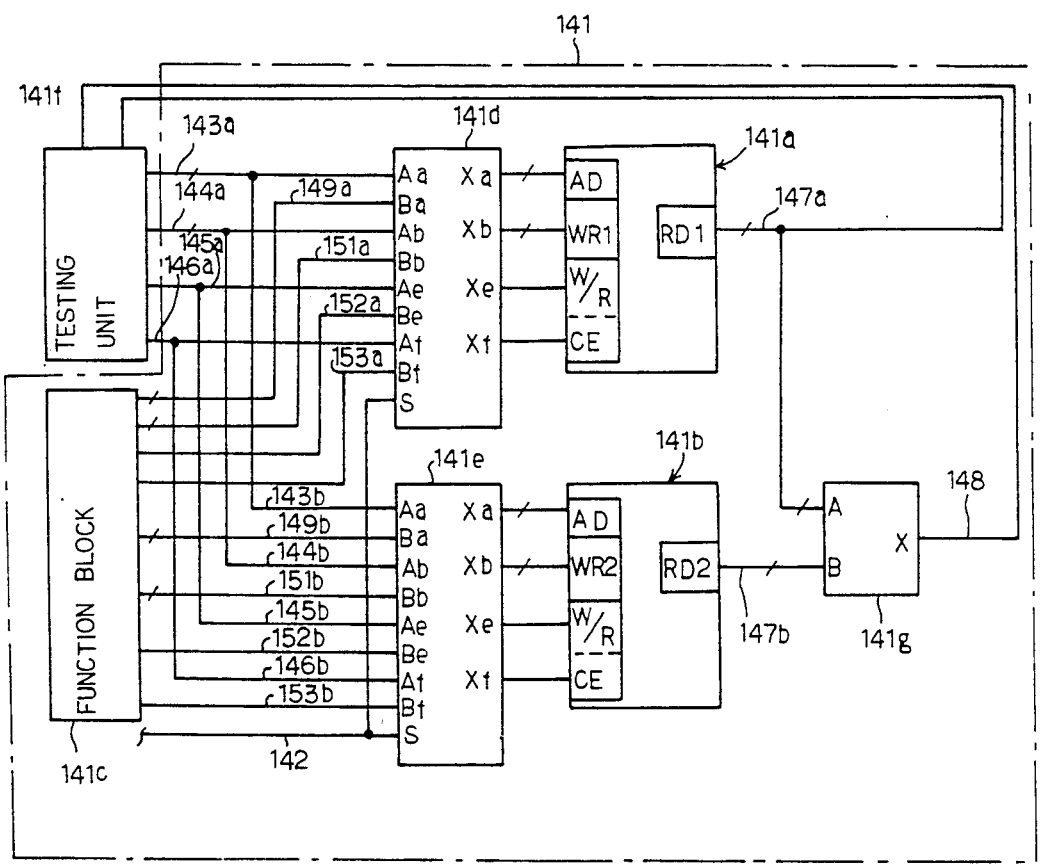
FIG. 16 is a diagram showing the arrangement of yet another semiconductor integrated circuit implementing a seventh embodiment according to the present invention.

Turning to FIG. 16, a semiconductor integrated circuit 141 is implemented by two single port random access memory devices 141a and 141b associated with a function block 141c, and two selecting circuits 141d and 141e are provided for steering various data and controlling signals from the function block 141c and a testing unit 141f. A comparator circuit 141g is coupled at the input ports thereof to read-out data ports RD1 and RD2 of the single port random access memory devices 141a and 141b. The semiconductor integrated circuit 141 selectively enters a functional testing mode and a usual mode of operation, and a selecting signal S on a selecting signal line shifts the selecting circuits 141d and 141e depending upon the mode of operation.

The testing unit 141f is coupled in parallel through address lines 143a, write-in data lines 144a and controlling signal lines 145a and 146a to ports Aa, Ab, Ae and Af of the selecting circuit 141d. Auxiliary address lines 143b, auxiliary write-in data lines 144b, and auxiliary controlling signal lines 145b and 146b are branched from the address lines 143a, the write-in data lines 144a and the controlling signal lines 145a and 146a, respectively, and are coupled to ports Aa, Ab, Ae and Af. Since an acceptable write-in data is equal in the number of parallel bits to the write-in data lines 144a or 144b, the selecting circuits 141d and 141e directly supply a multi-bit testing data to write-in ports WR1 and WR2 of the single port random access memory devices 141a and 141b in the presence of the selecting signal S indicative of the functional testing mode. The single port random access memory devices 141a and 141b have respective read-out data ports RD1 and RD2 which are coupled through two sets of read-out data lines 147a and 147b to two input ports A and B of the comparator circuit 141g. The read-out signal lines 147a are further coupled to an input port of the testing unit 141f, and a reporting line 148 propagates a reporting signal indicative of consistency or inconsistency between parallel bits at the input port A and parallel bits at the input port B to the input port of the testing unit 141f. The function block 141c selectively supplies address bits, a multi-bit write-in data, a write/read controlling signal and a chip enable signal through two sets of address lines 149a and 149b, two sets of write-in data lines 151a and 151b and two sets of controlling lines 152a/153a and 152b/153b to two sets of input ports Ba, Bb, Be and Bf of the selecting circuits 141d and 141e. Although various additional signal lines are incorporated in the semiconductor integrated circuit 141, these signal lines are deleted from FIG. 16, because they do not directly concern the gist of the present invention.

In operation. the selecting signal S causes the selecting circuits 141d and 141e to interconnect the input ports Ba to Bf and the associated single port random access memory devices 141a and 141b, and the function block 141c selectively activates one of the single port random access memory devices 141a and 141b with the chip enable signal CE. When the single port random access memory device 141a or 141b is activated, a write-in data is written into memory cells designated by the address bits, or a read-out data is read out from the memory cells designated by the address bits.

However, if the semiconductor integrated circuit 141 enters the functional testing mode of operation, the testing unit simultaneously activates both single port random access memory devices 141a and 141b, and causes them to operate in the write-in mode with the write/read controlling signal W/R. The testing unit 141f simultaneously supplies a multi-bit testing data through the selecting circuits 141d and 141e to the write-in ports WR1 and WR2 of the random access memory devices 141a and 141b, and, then, increments address indicated by the address bits. The multi-bit testing data is concurrently written into the memory cells of both single port random access memory devices 141a and 141b designated by the address bits in every single write-in operation. After the write-in operation is completed for all of the memory cells, the testing unit changes the single port random access memory devices 141a and 141b to the read-out mode, and the address is incremented again. Then, the testing data is read-out from each single port random access memory device 141a or 141b as a read-out data in every single read-out operation. The read-out data read out from the single port random access memory device 141a is compared with the read-out data read out form the single port random access memory device 141b for producing the reporting signal indicative of consistency or inconsistency. The read-out data on the read-out data lines 147a and the reporting signal 148 are transferred to the testing unit 141f, and the testing unit 141f examines to see whether or not a detective memory cell is incorporated in the single port random access memory devices 141a and 141b.

Figure 9:
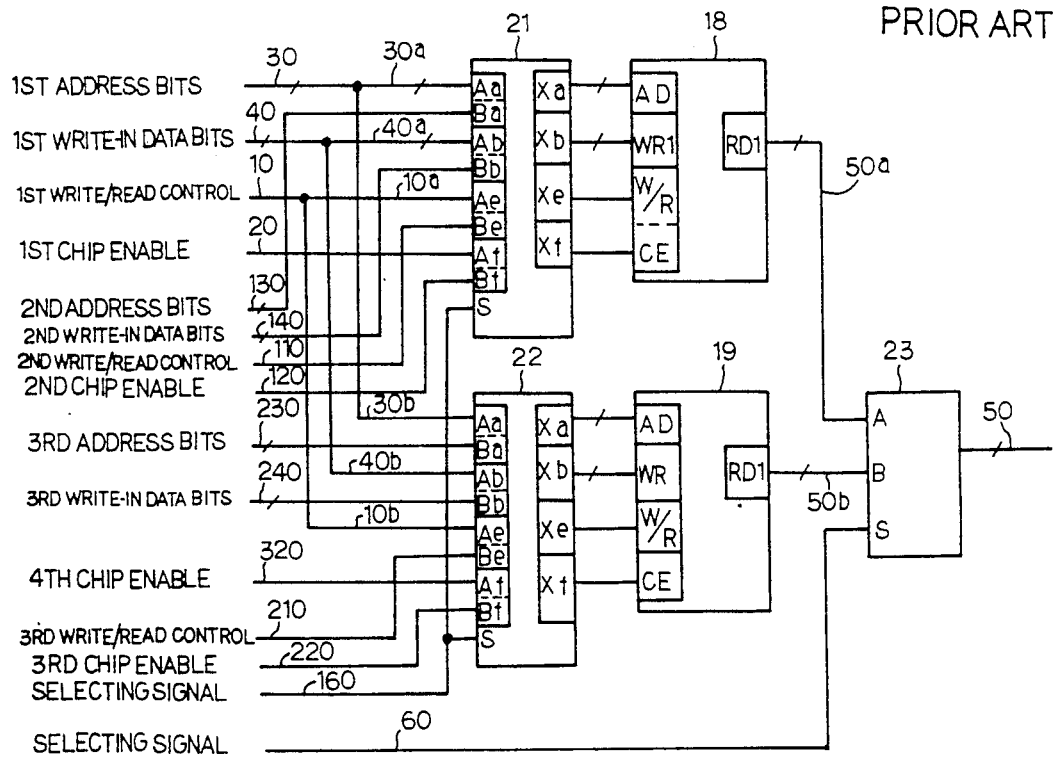
FIG. 9 is a diagram showing yet another prior art wiring arrangement around two random access memory devices incorporated in a semiconductor integrated circuit associated with two sets of signal lines.

The functional testing operation is completed at time t2 (see FIG. 4), and is shorter than the functional testing operation on the prior art single port random access memory devices 18 and 19 shown in FIG. 9, because both single port random access memory devices 141a and 141b are simultaneously subjected to the functional testing operation.

Eighth Embodiment

Figure 17:
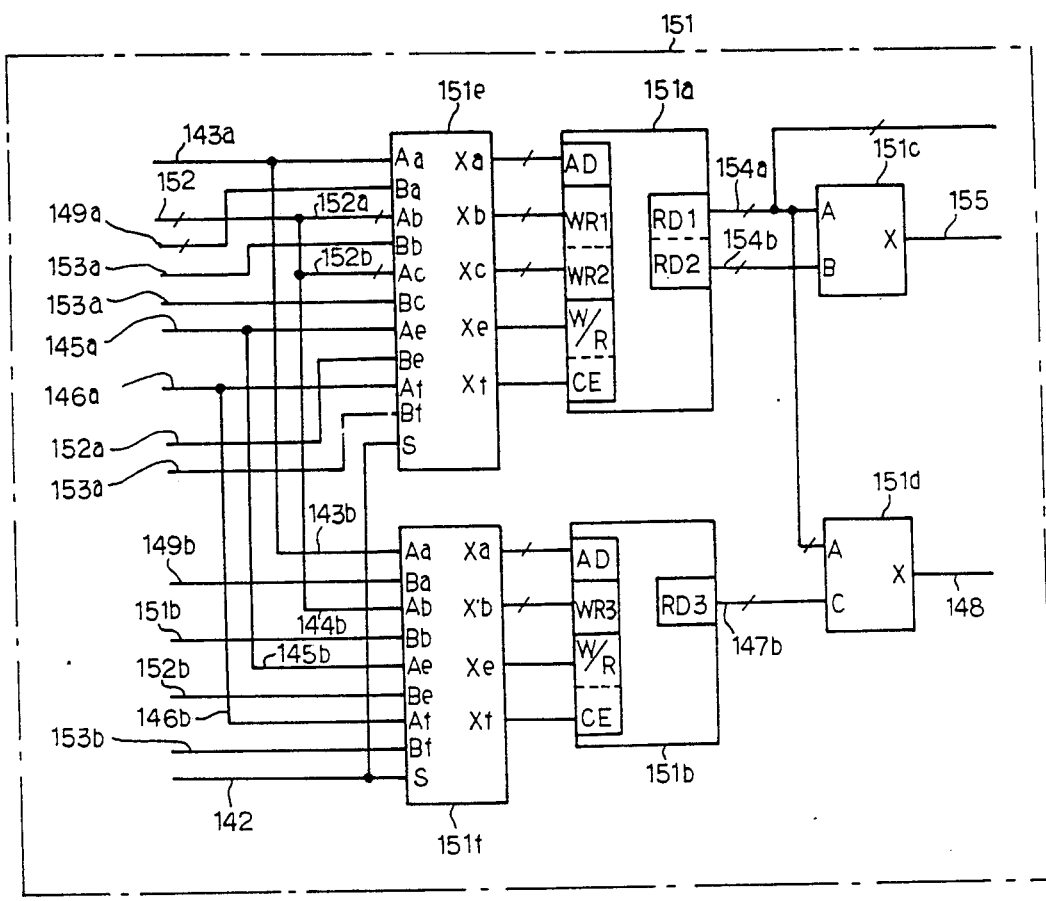
FIG. 17 is a diagram showing the arrangement of yet another semiconductor integrated circuit implementing an eighth embodiment according to the present invention.

Turning to FIG. 17, a semiconductor integrated circuit 151 embodying the present invention comprises two single port random access memory devices 151a and 151b, two comparator circuits 151c and 151d, and two selecting circuits 151e and 151f. The semiconductor integrated circuit 151 is of a compromise between the fifth and seventh embodiments, because the single port random access memory device 141a is replaced with the single port random access memory device 111a. Though not shown in FIG. 17, the semiconductor integrated circuit 151 further has a function block, and a testing unit is communicable with the single port random access memory devices 151a and 151b. Since an acceptable write-in data is twice as large in the number of parallel bits as a testing data produced by the testing unit, write-in data lines 152 coupled to the testing unit are bifurcated, and two sets of auxiliary write-in data lines 152a and 152b are coupled in parallel between the write-in data lines 152 and two ports Ab and Ac of the selecting circuit 151e. Similarly, the function block is coupled through two sets of write-in data lines 153a and 153b to two input ports Bb and Bc of the selecting circuit 151e for providing a multi-bit write-in data. Two parts RD1 and RD2 of a read-out port of the single port random access memory device 151a are coupled through two sets of read-out data lines 154a and 154b to two input ports of the comparator circuit 151c, and a reporting signal line 155 propagates a reporting signal indicative of consistency or inconsistency to an input port of the testing unit. The read-out data lines 154a and the reporting signal line 148 are coupled to the input port of the testing unit. However, other arrangement is similar to that of the seventh embodiment, and, for this reason, the same references designate corresponding components and signal lines without any detailed description. With the parallel bits on the read-out data lines 154a and the two reporting signals, the testing unit simultaneously examines the single port random access memory devices 151a and 151b to see if a detective memory cell is incorporated in the single port random access memory devices 151a and 151b, and the functional testing operation is completed at time t2 (see FIG. 4). The sequence of the functional testing operation is similar to that of the seventh embodiment, and, therefore, no further description is incorporated hereinbelow.

Ninth Embodiment

Figure 18:
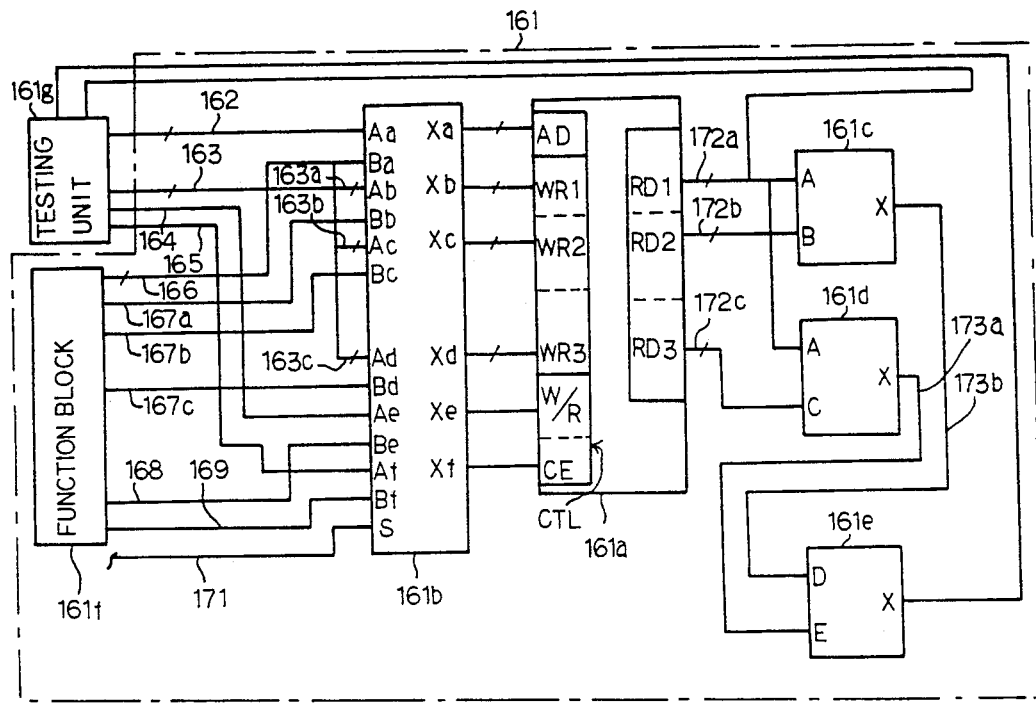
FIG. 18 is a diagram showing the arrangement of yet another semiconductor integrated circuit implementing a ninth embodiment according to the present invention.

Turning to FIG. 18, a semiconductor integrated circuit 161 embodying the present invention comprises a single port random access memory device 161a, a selecting circuit 161b, and three comparator circuits 161c, 161d and 161e. The single port random access memory device 161a is provided in assocaition with a function block 161f, and achives a predetermined task in a usual mode of operation. A testing unit 161g is communicable with the single port random access memory device 161a in a functional testing mode, and a functional testing operation is carried out to see if a detective memory cell is incorporated in the single port random access meory device 161a. The single port random access memory device 161a is available for a write-in data port three times as large in the number of parallel bits as a multi-bit testing data produced by the testing unit 161g, and a write-in port is virtually divided is coupled to address lines 162, write-in address lines 163 and two controling lines 164 and 165 for a write/read controling siganl and a chip enable signal. The address lines 162 and the controlling lines 164 and 165 are directly coupled to input ports Aa, Ae and Af, however, three sets of auxiliary wrte-in data lines 163a, 163b and 163c distributes the multi-bit testing data on the write-in data lines 163 to three input ports Ab, Ac and Ad. On the other hand, the function block 161f is coupled to address lines 166, three sets of write-in data lines 167a, 167b and 167c and controling signal lines 168 and 169 which in tern are directly coupled to input ports Ba, Bb, Bc, Bd, Bc, Bd, Be and Bf of the selecting circuit 161b, and a selecting signal S on a selecting signal line 171 causes the selecting circuit 161b to selectively couple the input ports Aa to Af and Ba to Bf with output ports Xa to Xf which in turn are coupled to the address port AD, the write-in ports WR1 to WR3 and the controlling port CTL of the single port random access memory device 161a. The single port random access memory device 161a further has three parts RD1, RD2 and RD3 of a read-out port, and the parts RD1 and RD2 are coupled through two sets of read-out data lines 172a and 172b to two input ports A and B of the comparator circuit 161c. The other part RD3 is coupled through a set of read-out data lines 172c to an input port C of the comparator circuit 161d, and the other input port A of the comparator circuit 161d is coupled to the read-out data lines 172a. The read-out data lines 172a are further ocupled to an input port of the testing unit 161g. The ourput ports X of the comparator circuits 161c and 161d are coupled to two input ports D and E of the comparator circuit 161e, and the output port of the comparatir circuit 161e is coupled to the input port of the testing unit 161g. Although additional signal lines and blocks are incorporated in the semiconductor integrated circuit 161, they are omitted from FIG. 18 for the sake of simplicity. In this instance, the comparator circuit 161e is implemented by an OR gate or an AND gate depending upon the logic level of consistency.

While the semiconductor integrated circuit 161 is in the usual mode, the selecting signal S causes the selecting circuit 161b to interconnect the input port Ba to Bf and the output ports Xa to Xf, and the function block 161f writes a multi-bit write-in data into or reads out a multi-bit read-out data from the single port random access memory device 161a.

However, if the functional testing mode is established, the selecting signal S shifts the selecting cirucit 161b so as to interconnect the input ports Aa to Af to the output ports Xa to Xf, and the testing unit 161g shifts the write/read controling signal line 164 to a predetermined level indicative of the write-in mode. Then, the multi-bit testing data is fed to the write-in data lines 163. The testing data is distributed through the three sets of auxiliary write-in data lines 163a to 163c to the input ports Ab to Ad, and is written into the single port random access memory device 161a. The testing unit 161g increments the address indicated by the address bits, and the multi-bit testing data is written into all of the memory cells of the single port random access memory device 161a.

Upon completion of the write-in operation on all of the memory cells, the testing unit 161g changes the single port random access memory device 161a to the read-out mode with the write/read controlling signal W/R. The address is sequentially incremented, and the testing data is read-out from the memory cells to the read-out port RD1 to RD3 as a multi-bit read-out data in every read-out operaiton. Each read-out data are transferred from the read-out port RD1 to RD3 to the input ports A, B and C of the comparator circuits 161c and 161d, and the comparator circuits 161c and 161d respectively produces output signals each indicative of consistency or inconsistency. The output signals are fed through signal lines 173a and 173b to input ports D and E of a comparator circuit 161e, and the comparator circuit 161e produces a reporting signal indicative of consistency or inconsistency of the output signals of the comparator circuits 161c and 161d. Assuming now that a read-out bit on the read-out data lines 172a is inverted in the memory cell, both comparator circuits 161c and 161d produces the output signals of logic "0" level, respectively, and the comparator circuit 161e implemented by the AND gate produces the reporting signal of logic "0" level indicative of inconsistency. If the inverted read-out data bit is fed to either set of read-out data lines 172b or 172c, one of the comparator circuit 161c or 161d produces the output signal of logic "0" level, and the other comparator circuit 161d or 161c produces the output signal of logic "1" level. However, the comparator circuit implemented by the AND gate produces the reporting signal of logic "0" level indicative of inconsistency.

The functional testing operation is completed at time t2 (see FIG. 4), and the testing unit 161g completes the functional test within a relatively short time period.

Tenth Embodiment

Figure 19:
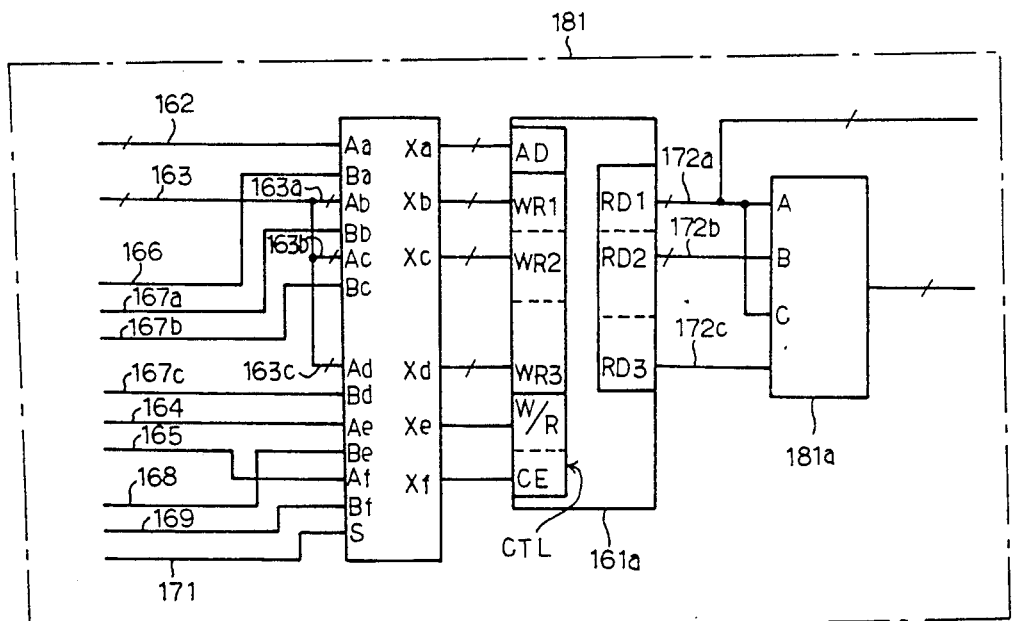
FIG. 19 is a diagram showing the arrangement of yet another semiconductor integrated circuit implementing a tenth embodiment according to the present invention.

Turning to FIG. 19, yet another semiconductor integrated circuit 181 embodying the present invention is illustrated. In the semiconductor integrated circuit 161, the comparator circuits 161c to 161e are integrated in a single comparator unit 181a, however, other component circuits and signal lines are similar to those of the ninth embodiment. For this reason, the same references designate corresponding circuits and signal lines without any detailed description.

Eleventh Embodiment

Figure 20:
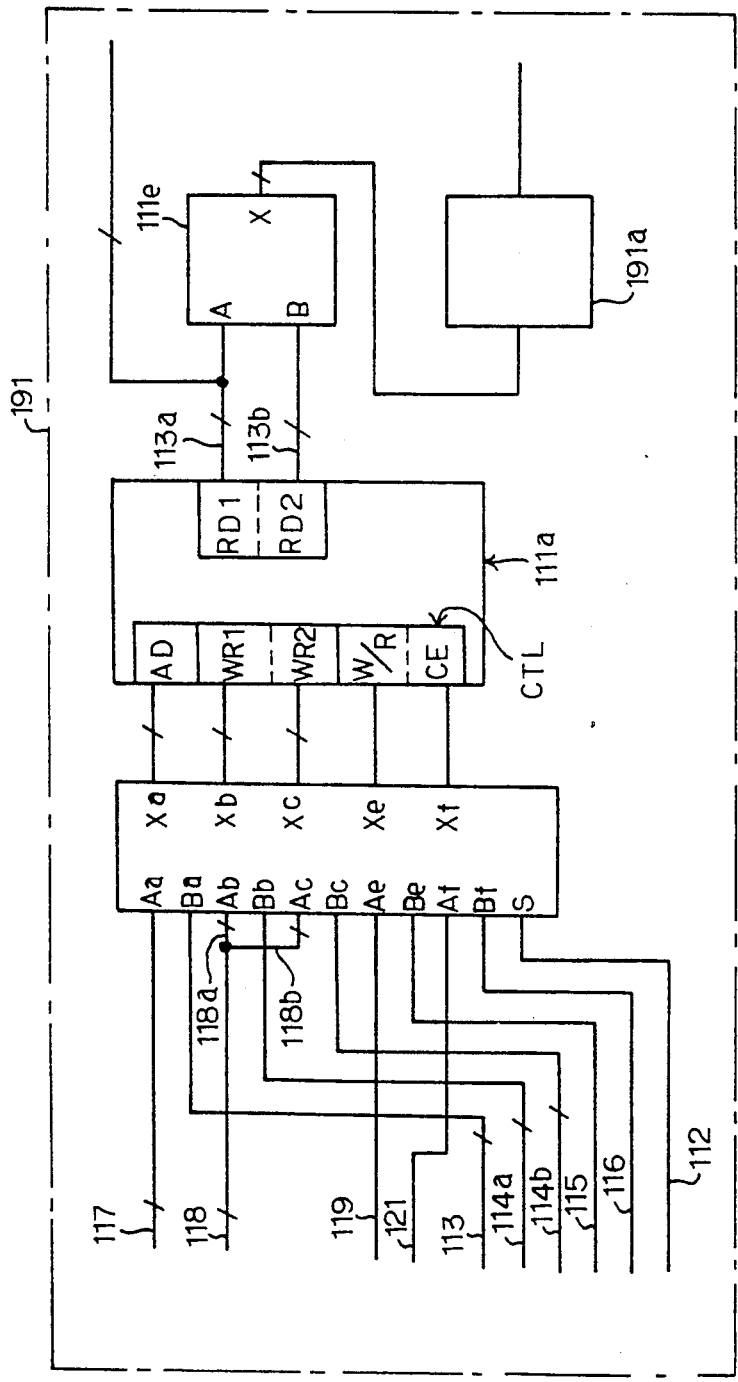
FIG. 20 is a diagram showing the arrangement of yet another semiconductor integrated circuit implementing a eleventh embodiment according to the present invention.

FIG. 20 shows a semiconductor integrated circuit 191 embodying the present invention. The semiconductor integrated circuit 191 is similar to the semiconductor integrated circuit 111 shown in FIG. 14 except for a comparator circuit 191a, and other component circuits and signal lines are designated by the same references used in FIG. 14. The comparator circuit 111e produces a multi-bit repqrting signal at the output port X thereof, and the multi-bit reporting signal is fed to the comparator circuit 191a implemented by an OR gate or an AND gate. The comparator circuit 191a implemented by the AND gate produces a single bit reporting signal if all the component bits are logic "1" indicative of consistency. However, if at least one component bit is logic "0", the single bit reporting signal is also logic "0" indicative of inconsistency. On the other hand, the comparator circuit 191a implemented by an OR gate can detect inconsistency.

Although particular embodiments of the present invention have been shown and described, it will be obvious to those skilled in the art that various changes and modifications may be made without departing from the spirit and scope of the present invention. For example, the write-in data port and the read-out data port of a random access memory device may be grouped into more than three without increasing the write-in data lines. Moreover, a random access memory device forming a part of a semiconductor integrated circuit has more than one write-in data ports and more than one read-out data ports.

What is claimed is:

1. A semiconductor integrated circuit which is communicable with a testing unit in a functional testing mode of operation, said testing unit producing multi-bit testing data, said circuit comprising:

a) a random access memory circuit having a multi-bit write-in data port for multi-bit write-in data, and a multi-bit read-out data port for multi-bit read-out data, said write-in data port being divided into a plurality of parts, said read-out data port being divided into a plurality of parts, said testing unit being further coupled through address lines, a write/read controlling line and a chip enable line to said memory circuit, and in which said memory circuit is of a random access memory type;

b) write-in data lines which are equal in number to the number of parallel bits of said multi-bit testing data and which are supplied with said multi-bit testing data in said functional testing mode of operation;

c) a plurality of auxiliary write-in data line groups, each of said groups comprising a number of auxiliary write-in data lines which is equal to the number of said write-in data lines, and which is coupled in parallel between said write-in data lines and said plurality of parts of said multi-bit write-in data port;

d) a plurality of read-out data line groups respectively coupled to said plurality of parts of said multi-bit read-out data port for propagating said multi-bit read-out data, one of said plurality of read-out data line groups being further coupled to said testing unit; and e) a comparator unit having a plurality of input ports respectively coupled to said plurality of read-out data line groups, and operative to compare read-out data bits on one of said plurality of read-out data line groups with read-out data bits on the other of said plurality of read-out data line groups for producing a reporting signal which is indicative of either a consistency or an inconsistency between said read-out data bits on said one of said plurality of read-out data line groups and said read-out data bits on the other of said plurality of read-out data line groups, said reporting signal being fed to said testing unit, wherein said testing unit checks the read-out data bits on said one of said plurality of read-out data line groups and said reporting signal to see whether or not there is a trouble in said memory circuit, each of said multi-bit write-in data port and said multi-bit read-out data port being divided into first, second and third parts, said comparator unit being implemented by first and second comparator circuits, said first and second parts of said multi-bit read-out data port being electrically coupled to said first comparator circuit, said first and third parts of said multi-bit read-out data port being electrically coupled to said second comparator circuit, said first part of said multi-bit read-out data port being coupled to said one of said plurality of read-out data line groups.

2. A semiconductor integrated circuit as set forth in claim 1, in which said reporting signal is constituted by two multi-bit sub-signals respectively produced by said first and second comparator circuits, and in which each of said multi-bit sub-signals is constituted by a plurality of component bits each indicative of consistency or inconsistency between a read-out data bit at said first part of said multi-bit read-out data port and a read-out data bit at one of said second and third parts of said multi-bit read-out data port.

3. A semiconductor integrated circuit which is communicable with a testing unit in a functional testing mode of operation, said testing unit producing multi-bit testing data, said circuit comprising:

a) a memory circuit having a multi-bit write-in data port for multi-bit write-in data, and a multi-bit read-out data port for multi-bit read-out data, said write-in data port being divided into a plurality of parts, said read-out data port being divided into a plurality of parts;

b) write-in data lines equal in number to the number of parallel bits of said multi-bit testing data and supplied with said multi-bit testing data while in said functional testing mode of operation;

c) a plurality of auxiliary write-in data line groups, each of said groups comprising a number of auxiliary write-in data lines which is equal to the number of said write-in data lines, and which is coupled in parallel between said write-in data lines and said plurality of parts of said multi-bit write-in data port;

d) a plurality of read-out data line groups respectively coupled to said plurality of parts of said multi-bit read-out data port for propagating said multi-bit read-out data, one of said plurality of read-out data line groups being further coupled to said testing unit;

e) a comparator unit having a plurality of input ports respectively coupled to said plurality of read-out data line groups, said comparator unit being operative to compare read-out data bits on one of said plurality of read-out data line groups with read-out data bits on the other of said plurality of read-out data line groups for producing a reporting signal which is indicative of either a consistency or an inconsistency between said read-out data bits on said one of said plurality of read-out data line groups and said read-out data bits on the other of said plurality of read-out data line groups, said reporting signal being fed to said testing unit; and f) a selecting unit having first input ports and second input ports selectively coupled to output ports thereof depending upon a selecting signal, said output ports being coupled to said memory circuit, said plurality of auxiliary write-in data line groups being coupled to said write-in data lines, first address lines, a first write/read controlling line and a first chip enable line being coupled to said first input ports of said selecting unit, said second input ports of said selecting unit being coupled through second address lines, second write-in data lines, a second write/read controlling line and a second chip enable line to an electric circuit in a usual mode of operation, wherein said testing unit checks the read-out data bits on said one of said plurality of read-out data line groups and said reporting signal to determine whether or not a trouble is taking place in said memory circuit, each of said multi-bit write-in data port and said multi-bit read-out data port being divided into first, second and third parts, said comparator unit being implemented by first and second comparator circuits, said first and second parts of said multi-bit read-out data port and said first and third parts of said multi-bit read-out data port being electrically coupled to two input ports of said first comparator circuit and two input ports of said second comparator circuit, respectively, said reporting signal being constituted by two multi-bit sub-signals respectively produced by said first and second comparator circuits, each of said two multi-bit sub-signals being constituted by a plurality of component bits each indicative of either a consistency or an inconsistency between a read-out data bit at said first part of said multi-bit read-out data port and a read-out data bit at said second or third part of said multi-bit read-out data port.

4. A semiconductor integrated circuit which is communicable with a testing unit in a functional testing mode of operation, said testing unit producing multi-bit testing data, said circuit comprising:
- a) a memory circuit having a multi-bit write-in data port for multi-bit write-in data, and a multi-bit read-out data port for multi-bit read-out data, said write-in data port being divided into a plurality of parts, said read-out data port being divided into a plurality of parts;
- b) write-in data lines equal in number to the number of parallel bits of said multi-bit testing data and supplied with said multi-bit testing data while in said functional testing mode of operation;
- c) a plurality of auxiliary write-in data line groups, each of said groups comprising a number of auxiliary write-in data lines which are equal to the number to said write-in data lines, and being coupled in parallel between said write-in data lines and said plurality of parts of said multi-bit write-in data port;
- d) a plurality of read-out data line groups respectively coupled to said plurality of parts of said multi-bit read-out data port for propagating said multi-bit read-out data, one of said plurality of read-out data line groups being further coupled to said testing unit;
- e) a comparator unit having a plurality of input ports respectively coupled to said plurality of read-out data line groups, and operative to compare read-out data bits on one of said plurality of read-out data line groups with read-out data bits on the other of said plurality of read-out data line groups for producing a reporting signal indicative of either a consistency or an inconsistency between said read-out data bits on said one of said plurality of read-out data line groups and said read-out data bits on the other of said plurality of read-out data line groups, said reporting signal being fed to said testing unit; and
- f) a selecting unit having first input ports and second input ports selectively coupled to output ports thereof depending upon a selecting signal, said output ports being coupled to said memory circuit, said plurality of auxiliary write-in data line groups being coupled to said write-in data lines, first address lines, a first write/read controlling line and a first chip enable line being coupled to said first input ports of said selecting unit, said second input ports of said selecting unit being coupled through second address lines, second write-in data lines, a second write/read controlling line and a second chip enable line being coupled to an electric circuit in a usual mode of operation,
- wherein said testing unit checks the read-out data bits on said one of said plurality of read-out data line groups and said reporting signal to determine whether or not there is trouble in said memory circuit, each of said multi-bit write-in data port and said multi-bit read-out data port being divided into two parts coupled through said plurality of read-out data line groups to a main comparator circuit forming a part of said comparator unit, said comparator unit further having an auxiliary comparator circuit supplied with a multi-bit output signal of said main comparator circuit for producing a single bit reporting signal.

5. A semiconductor integrated circuit which is communicable with a testing unit in a functional testing mode of operation, said testing unit producing multi-bit testing data, said circuit comprising:
- a) a memory circuit having a multi-bit write-in data port for multi-bit write-in data, and a multi-bit read-out data port for multi-bit read-out data, said write-in data port being divided into a plurality of parts, said read-out data port being divided into a plurality of parts;
- b) write-in data lines equal in number to the number of parallel bits of said multi-bit testing data and being supplied with said multi-bit testing data in said functional testing mode of operation;
- c) a plurality of auxiliary write-in data line groups, each group comprising a number of auxiliary write-in data lines which is equal to the number to said write-in data lines, and which is coupled in parallel between said write-in data lines and said plurality of parts of said multi-bit write-in data port;
- d) a plurality of read-out data line groups respectively coupled to said plurality of parts of said multi-bit read-out data port for propagating said multi-bit read-out data, one of said plurality of read-out data line groups being further coupled to said testing unit;
- e) a comparator unit having a plurality of input ports respectively coupled to said plurality of read-out data line groups, and being operative to compare read-out data bits on one of said plurality of read-out data line groups with read-out data bits on the other of said plurality of read-out data line groups for producing a reporting signal indicative of either a consistency or an inconsistency between said read-out data bits on said one of said plurality of read-out data line groups and said read-out data bits on the other of said plurality of read-out data line groups, said reporting signal being fed to said testing unit;
- f) a selecting unit having first input ports and second input ports selectively coupled to output ports thereof depending upon a selecting signal, said output ports being coupled to said memory circuit, said plurality of auxiliary write-in data line groups being coupled to said write-in data lines, first address lines, a first write/read controlling line and a first chip enable line being coupled to said first input ports of said selecting unit, said second input ports of said selecting unit being coupled through second address lines, second write-in data lines, a second write/read controlling line and a second chip enable line to an electric circuit in a usual mode of operation, and
- means wherein said testing unit checks the read-out data bits on said one of said plurality of read-out data line groups and said reporting signal to see whether or not there is trouble in said memory circuit, each of said multi-bit write-in data port and said multi-bit read-out data port being divided into first, second and third parts, said comparator unit being implemented by first, second and third comparator circuits, said first and second parts of said multi-bit read-out data port and said first and third parts of said multi-bit read-out data port being electrically coupled to two input ports of said first comparator circuit and two input ports of said second comparator circuit, respectively, each of the output signals respectively produced by said first and second comparator circuits being constituted by a plurality of component bits, each being indicative of either a consistency or an inconsistency between a read-out data bit at said first part of said multi-bit read-out data port and a read-out data bit at said second or third part of said multi-bit read-out data port, said output signals of said first and second comparator circuits being supplied to said third comparator circuit for producing a single bit reporting signal.

6. A semiconductor integrated circuit which is communicable with a testing unit in a functional testing mode of operation, said testing unit producing a multi-bit testing data, comprising:
 a) a plurality of memory circuits each having a multi-bit write-in data port for multi-bit write-in data, and a multi-bit read-out data port for multi-bit read-out data;
 b) write-in data lines equal in number to the number of parallel bits of said multi-bit testing data, said write-in data line propagating said multi-bit testing data;
 c) a plurality of auxiliary write-in data line groups each consisting of auxiliary write-in data lines which are equal in number to the number of said write-in data lines, said plurality of auxiliary write-in data line groups being coupled between said write-in data lines and said write-in ports of said plurality of memory circuits;
 d) a plurality of read-out data line groups each being coupled to said multi-bit read-out data port of one of said memory circuits, one of said read-out data line groups being further coupled to said testing unit;
 e) a comparator unit having a plurality of input ports respectively coupled to said plurality of read-out data line groups, and being operative to compare read-out data bits on one of said plurality of read-out data line groups with data bits on the other of said plurality of read-out data line groups for producing a reporting signal which is indicative of either a consistency or an inconsistency between said read-out data bits on said one of said plurality of read-out data line groups and said read-out data bits on the other of said plurality of read-out data line groups, said reporting signal being fed to said testing unit;
 f) a plurality of selecting circuits respectively associated with said plurality of memory circuits, said write-in data lines being coupled to said plurality of auxiliary write-in data line groups, first address lines, a first write/read controlling line and a first chip enable line being coupled to first input ports of each selecting circuits, second input ports of each selecting circuit being coupled through second address lines, second write-in data lines, a second write/read controlling line and a second chip enable line to an electronic circuit which is communicable with said plurality of memory circuits in a usual mode of operation, and
 means wherein said testing unit checks said read-out data bits on said one of said plurality of read-out data line groups and said reporting signal to determine whether or not there is trouble in said plurality of memory circuits, one of said plurality of memory circuits having said multi-bit read-out data port divided into a plurality of parts one of which is electrically coupled to a plurality of comparator circuits forming said comparator unit, the other of said parts and said multi-bit read-out data port of each of the other memory circuit being coupled to said comparator circuits.

* * * * *